United States Patent
Huang et al.

(10) Patent No.: US 8,564,954 B2
(45) Date of Patent: Oct. 22, 2013

(54) THERMALLY ENHANCED ELECTRONIC PACKAGE

(75) Inventors: Tzu Hsin Huang, Tainan County (TW); Yu Ting Yang, Tainan County (TW); Hung Hsin Liu, Tainan County (TW); An Hong Liu, Tainan County (TW); Geng Shin Shen, Tainan County (TW); Wei David Wang, Tainan County (TW); Shih Fu Lee, Tainan County (TW)

(73) Assignee: Chipmos Technologies Inc., Hsinchu (TW)

( * ) Notice: Subject to any disclaimer, the term of this patent is extended or adjusted under 35 U.S.C. 154(b) by 225 days.

(21) Appl. No.: 12/948,964

(22) Filed: Nov. 18, 2010

(65) Prior Publication Data

US 2011/0304991 A1    Dec. 15, 2011

Related U.S. Application Data

(60) Provisional application No. 61/354,927, filed on Jun. 15, 2010.

(51) Int. Cl.
*H05K 7/20* (2006.01)
*F28F 7/00* (2006.01)

(52) U.S. Cl.
USPC .......... 361/704; 165/80.2; 165/185; 361/708; 361/719; 361/720

(58) Field of Classification Search
USPC ....................................................... 361/708
See application file for complete search history.

(56) References Cited

U.S. PATENT DOCUMENTS

| | | | |
|---|---|---|---|
| 6,841,509 B1 | 1/2005 | Hwang et al. | |
| 6,872,236 B1 | 3/2005 | Hwang | |
| 7,156,958 B2 | 1/2007 | Hwang | |
| 2002/0060369 A1* | 5/2002 | Akram | 257/782 |
| 2004/0126303 A1 | 7/2004 | Hwang | |
| 2006/0008404 A1 | 1/2006 | Hwang | |
| 2006/0198108 A1* | 9/2006 | Refai-Ahmed et al. | 361/719 |
| 2007/0035930 A1* | 2/2007 | Sung et al. | 361/708 |
| 2007/0263362 A1* | 11/2007 | Laio et al. | 361/719 |
| 2008/0287591 A1 | 11/2008 | Hwang et al. | |
| 2009/0009973 A1* | 1/2009 | Wyland et al. | 361/705 |
| 2009/0213551 A1* | 8/2009 | Wyland | 361/708 |
| 2010/0155934 A1* | 6/2010 | Yim et al. | 257/704 |
| 2011/0141698 A1* | 6/2011 | Chiou et al. | 361/708 |

FOREIGN PATENT DOCUMENTS

| | | |
|---|---|---|
| CN | 1715360 | 1/2006 |
| CN | 101345222 | 1/2009 |

OTHER PUBLICATIONS

English Excerpt Translation of CN1715360 and CN101345222.
English Excerpt Translation of the Counterpart China Office Action Issued by SIPO on Nov. 16, 2012.
Counterpart China Office Action Issued by SIPO on Nov. 16, 2012.

* cited by examiner

*Primary Examiner* — Gregory Thompson
(74) *Attorney, Agent, or Firm* — WPAT, P.C.; Anthony King

(57) ABSTRACT

A thermally enhanced electronic package comprises a driver chip, an insulator, a flexible carrier, and carbon nanocapsules. The flexible carrier includes a flexible substrate, a wiring layer formed on the substrate, and a resistant overlaying the wiring layer. The driver chip is connected to the wiring layer. The insulator is filled in the gap between the driver chip and the flexible carrier. The carbon nanocapsules are disposed on the driver chip, on the resistant, on the flexible carrier, or in the insulator to enhance heat dissipation of electronic packages.

5 Claims, 32 Drawing Sheets

THERMALLY ENHANCED ELECTRONIC PACKAGE

CROSS REFERENCE TO RELATED APPLICATIONS

This Nonprovisional application claims priority under 35 U.S.C. §119(e) of U.S. Provisional Application No. 61/354,927, filed Jun. 15, 2010, the entire contents of which are hereby incorporated by reference.

BACKGROUND OF THE INVENTION

1. Field of the Invention

The present invention relates to a thermally enhanced electronic package, and more particularly, to an electronic package with high thermal dissipation capability.

2. Description of the Related Art

Continued demand for improved performance of semiconductor products results in greater operating frequencies and greater power consumption. Therefore, electrical packages having high thermal conductivity capable of effective heat dissipation to reduce the interconnect junction temperature are needed for such products. One example is a type of semiconductor device called a liquid crystal display (LCD) driver.

A typical LCD driver package is illustrated in FIG. 1. The LCD driver package 10 comprises a driver chip 11 and a tape carrier 14. The tape carrier 14 includes a polyimide (PI) substrate 143, a wiring layer (or copper foil) 142 formed on the substrate 143, and a resistant (solder mask) 141 overlaying the wiring layer 142. The driver chip 11 is mounted on the tape carrier 14 by flip-chip bonding. The bumps 13 formed on the active surface of the driver chip 11 are connected to the wiring layer 142 of the tape carrier 14. An insulator (or resin) 12 is filled in the gap between the driver chip 11 and a tape carrier 14 to protect the bumps 13 and the inner leads of the wiring layer 142.

Larger LCD television panel size and higher operating refresh rate demand high power/high density LCD drivers. Therefore, a heat sink is needed to lower the temperature of the LCD driver in a chip on film (COF) package, preferably below 70° C. Accordingly, FIGS. 2A to 2E show several typical LCD driver packages equipped with heat sinks.

As shown in FIG. 2A, the LCD driver package 20 comprises a driver chip 11 and a film carrier 24. The film carrier 24 includes a PI substrate 243, a wiring layer 242 formed on the substrate 243, and a resistant 241 overlaying the wiring layer 242. A first heat sink 251 is attached to the passive surface of the driver chip 11, and a second heat sink 252 is adhered to the substrate 243 by a thermal adhesive 26. To improve the thermal dissipation, conductive columns 244 connect the wiring layer 242 and the adhesive 26 through the substrate 243.

By contrast, the second heat sink 252 of the LCD driver package 20' is directly attached to the substrate 243, as shown in FIG. 2B. Compared with the configuration shown in FIG. 2A, the LCD driver package 2a in FIG. 2C also has two heat sinks (251, 252), but the second heat sink 252 is not underneath the driver chip 11. The layout of the wiring layer 242' of the film carrier 24' is different from that of the film carrier 24. The second heat sink 252 is adhered to the substrate 243 by the adhesive 26.

The LCD driver package 2b in FIG. 2D has only the second heat sink 252 which is directly attached to the substrate 243. The second heat sink 252' of the LCD driver package 2c in FIG. 2E is underneath the driver chip 11, and has an opening 253 aligned with the driver chip 11.

Considering the aforesaid conventional LCD driver packages, a common thermal dissipation method is to use a thermally conductive adhesive loaded with high percentage (by weight) of fillers to attach a sheet of aluminum film as a heat sink to the film side of the COF package. However, as an exposed surface of the aluminum heat sink needs to be further electrically insulated, an additional organic polymer film 37 with low thermal conductivity such as a polyimide film is repeatedly adhered on a surface of the second heat sink 252 of the COF (chip on film) package 30, as shown in FIG. 3. The organic polymer film 37 is attached to the second heat sink 252 by an additional adhesive 36.

The multilayer configuration makes the thermal management of the package very inefficient. In addition, the conventional thermal conductive adhesive depends on direct physical contact of filler particles for heat conducting. This requires high filler loading to ensure good contact between particles which makes the heat transfer very inefficient and sensitive to the surrounding temperature. Moreover, using aforesaid aluminum film as a heat sink, the bending capability of COF packages will become limited. Therefore, to remedy the conventional drawbacks, novel materials and methods are needed to improve the thermal performance of the package.

SUMMARY OF THE INVENTION

An aspect of the present invention is to provide a thermally enhanced electronic package. A dielectric resin material mixed with carbon nanocapsules (CNC) is used in the electronic packaging to improve thermal dissipation. As the CNC transfers and dissipates heat into infrared energy through absorption and radiation, the CNC mixed material is effective for thermal dissipation and is thus capable of reducing the operating temperature of the electronic package.

In view of the above, the present invention discloses a thermally enhanced electronic package which comprises a driver chip, an insulator, a flexible carrier, and carbon nanocapsules. The flexible carrier includes a flexible substrate, a wiring layer formed on the substrate, and a resistant overlaying the wiring layer. The driver chip is connected to the wiring layer. The insulator is filled in the gap between the driver chip and the flexible carrier. The dielectric resin mixed with carbon nanocapsules can be disposed on the driver chip, on the resistant, or on the flexible carrier. Alternatively, the carbon nanocapsules can also be disposed and mixed in the insulator.

The present invention further discloses a thermally enhanced electronic package which comprises a driver chip, an insulator, a flexible carrier, carbon nanocapsules, and at least one heat sink. The flexible carrier includes a flexible substrate, a wiring layer formed on the substrate, and a resistant overlaying the wiring layer. The heat sink is attached to the driver chip or the flexible carrier. The driver chip is connected to the wiring layer. The insulator is filled in the gap between the driver chip and the flexible carrier. The carbon nanocapsules are disposed on the driver chip, on the resistant, on the flexible carrier, in the insulator, or on the heat sink.

BRIEF DESCRIPTION OF THE DRAWINGS

The invention will be described according to the appended drawings in which:

FIGS. 4G to 4L show the IR images of the LCD driver package captured in FIG. 4F in which the driver chip (silicon chip) 11, the PI substrate 143, the insulator 12, the wiring layer 142 and the resistant 141 are all transparent to infrared radiation. The driver chip 11 of the LCD driver package 10 in FIG. 4F directly faces the IR light, but the PI substrate 143 of the LCD driver package 10 in FIG. 4A directly faces the IR light.

PREFERRED EMBODIMENT OF THE PRESENT INVENTION

Figure 1:
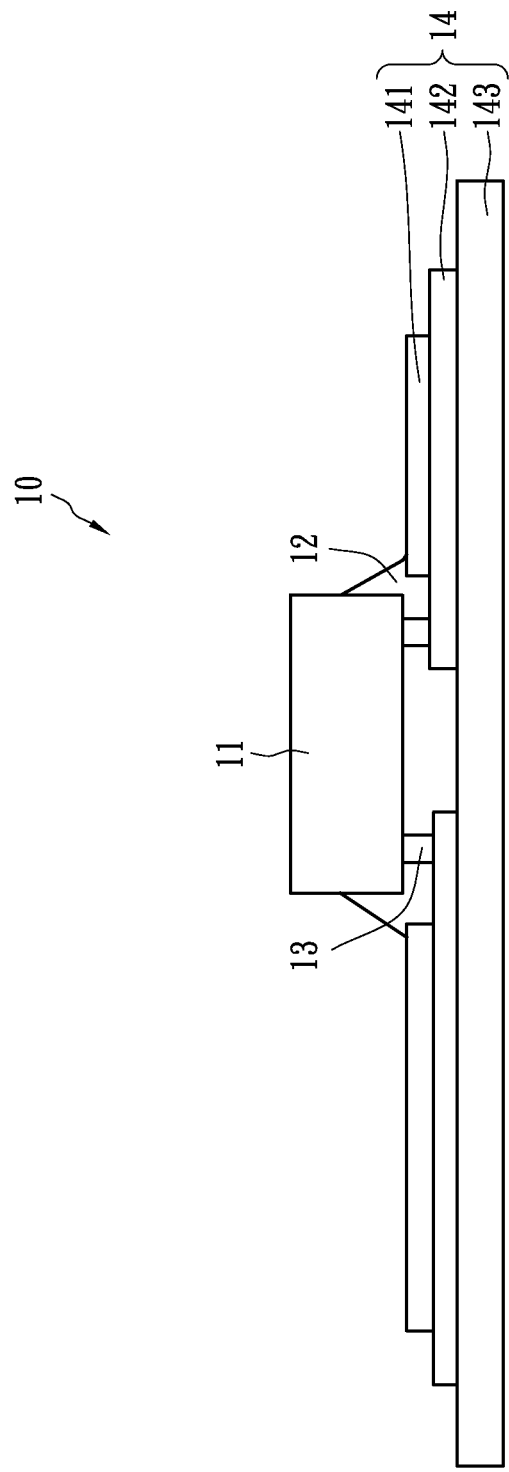
FIG. 1 is a cross-sectional diagram of a conventional LCD driver package.
Figure 2A:
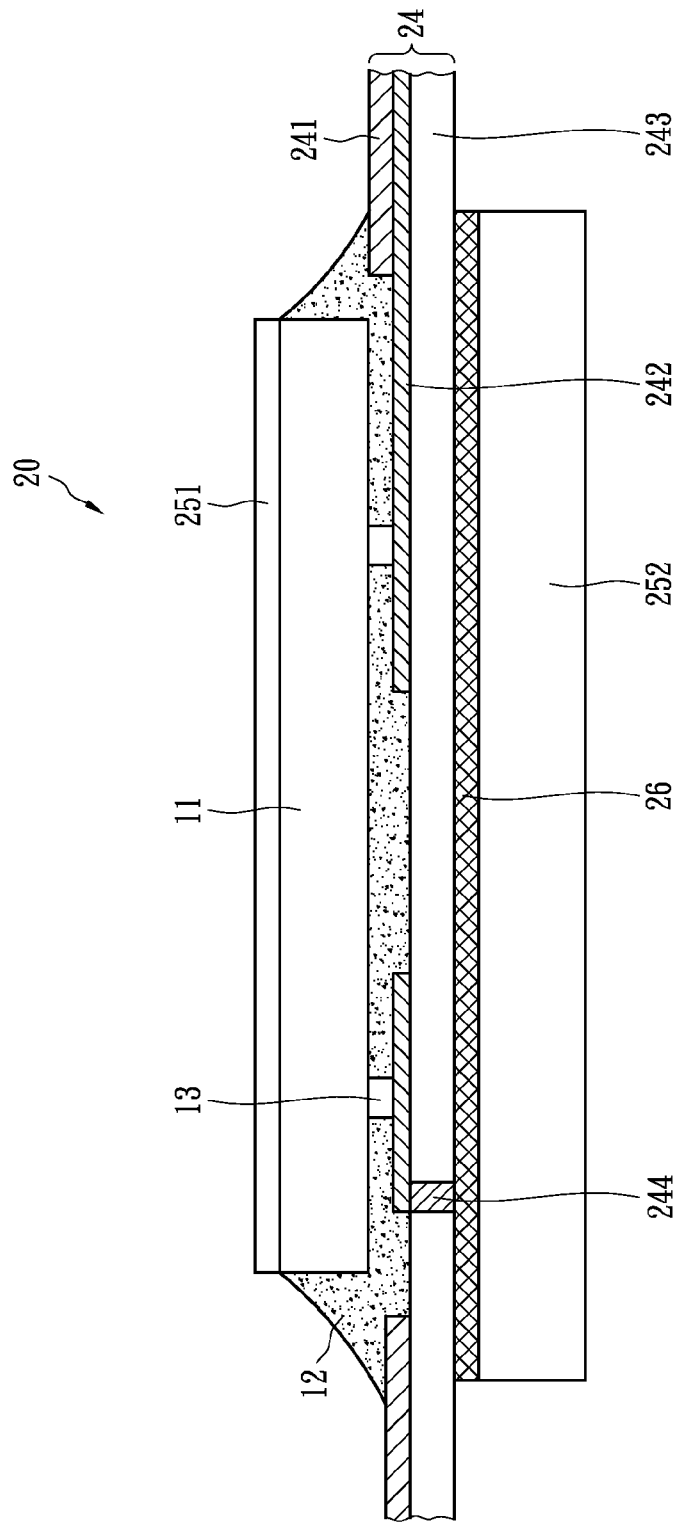
FIGS. 2A to 2E are cross-sectional diagrams of conventional LCD driver packages equipped with various formats of heat sinks.
Figure 2B:
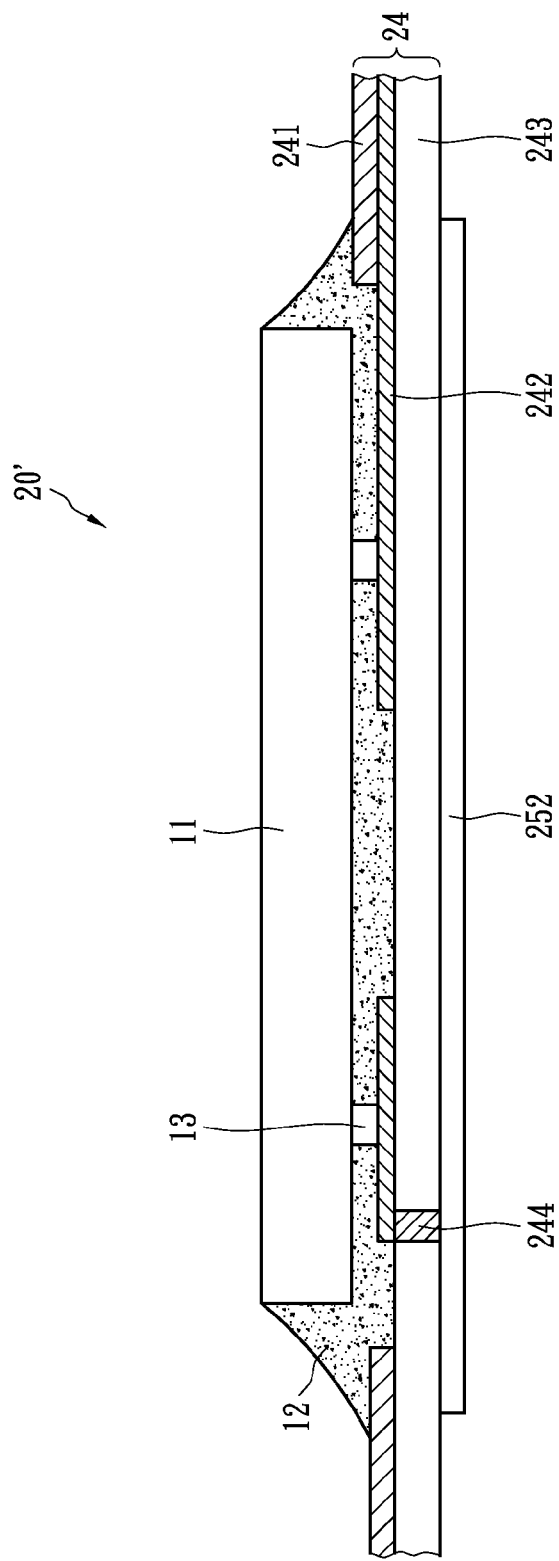
Figure 2C:
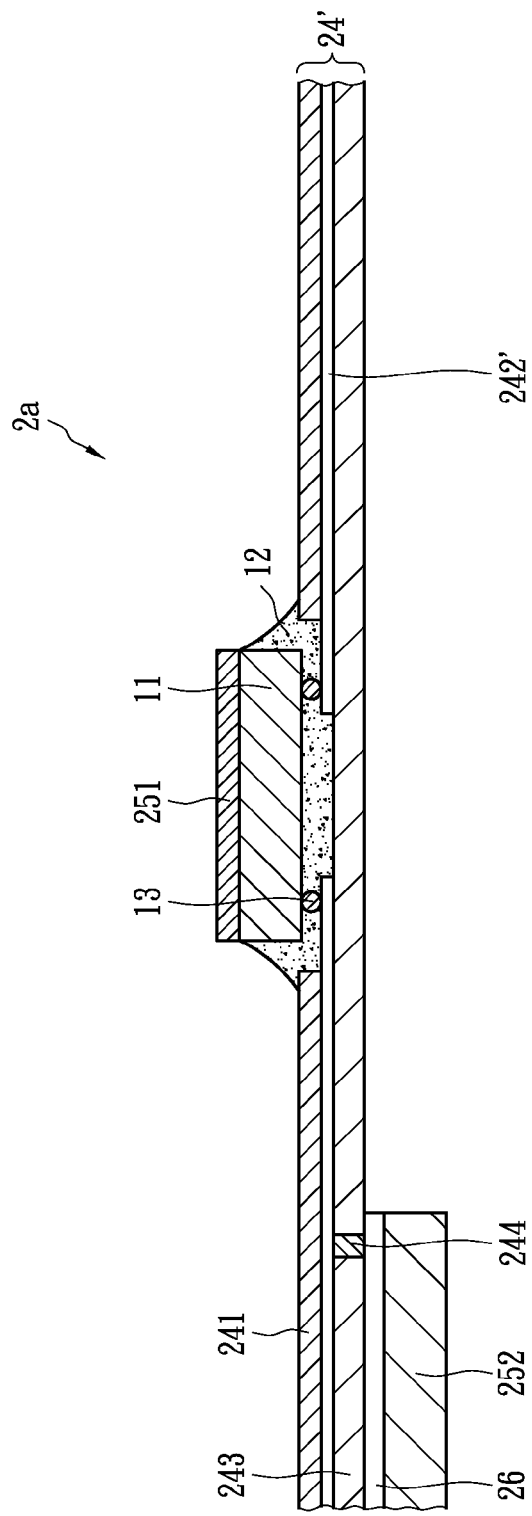
Figure 2D:
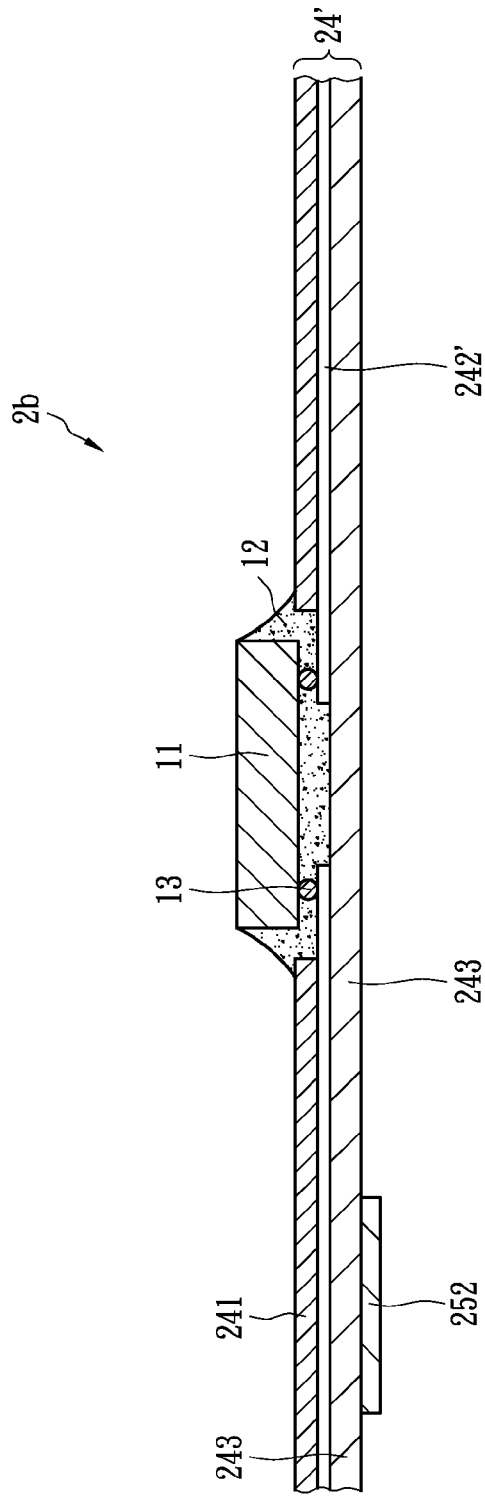
Figure 2E:
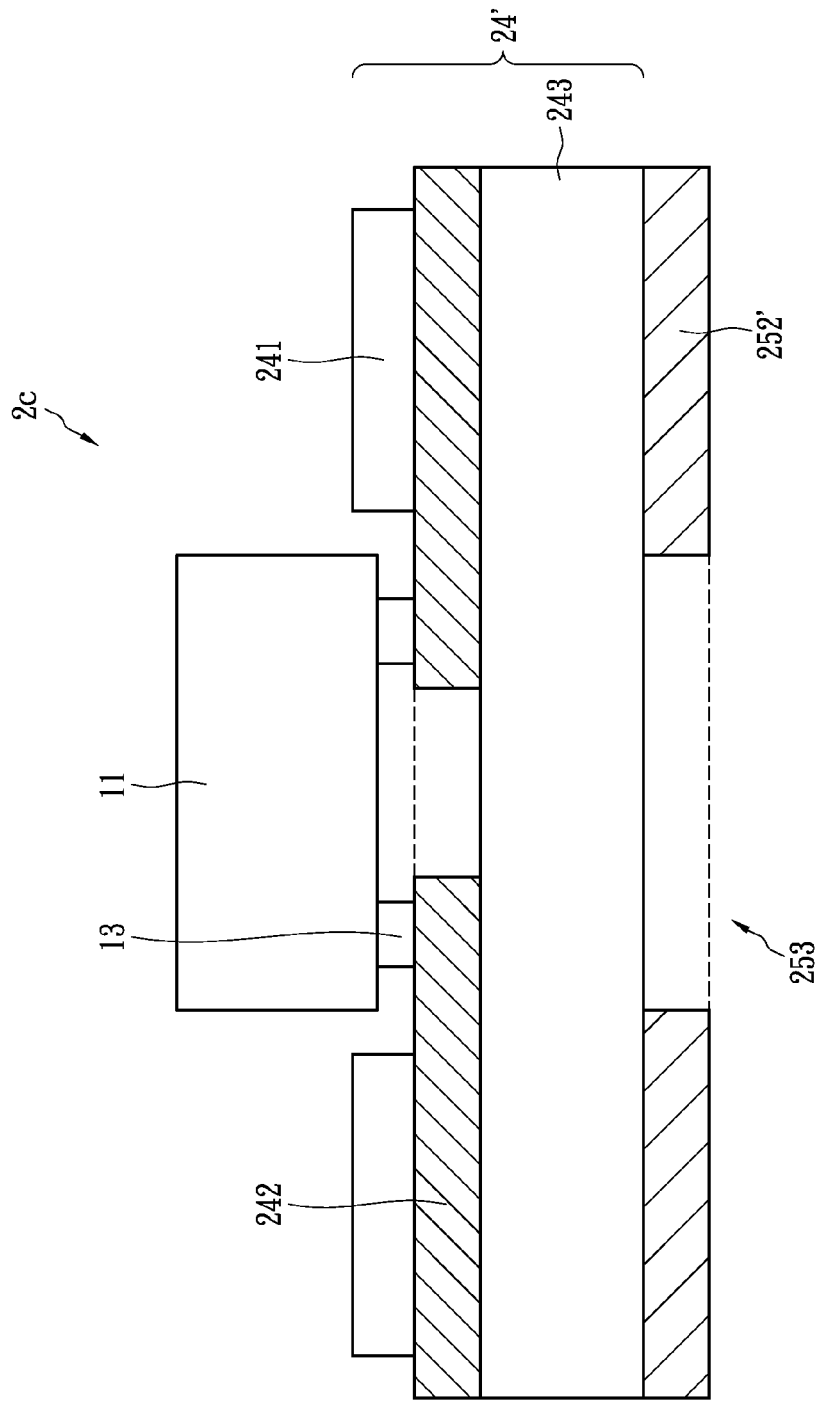
Figure 3:
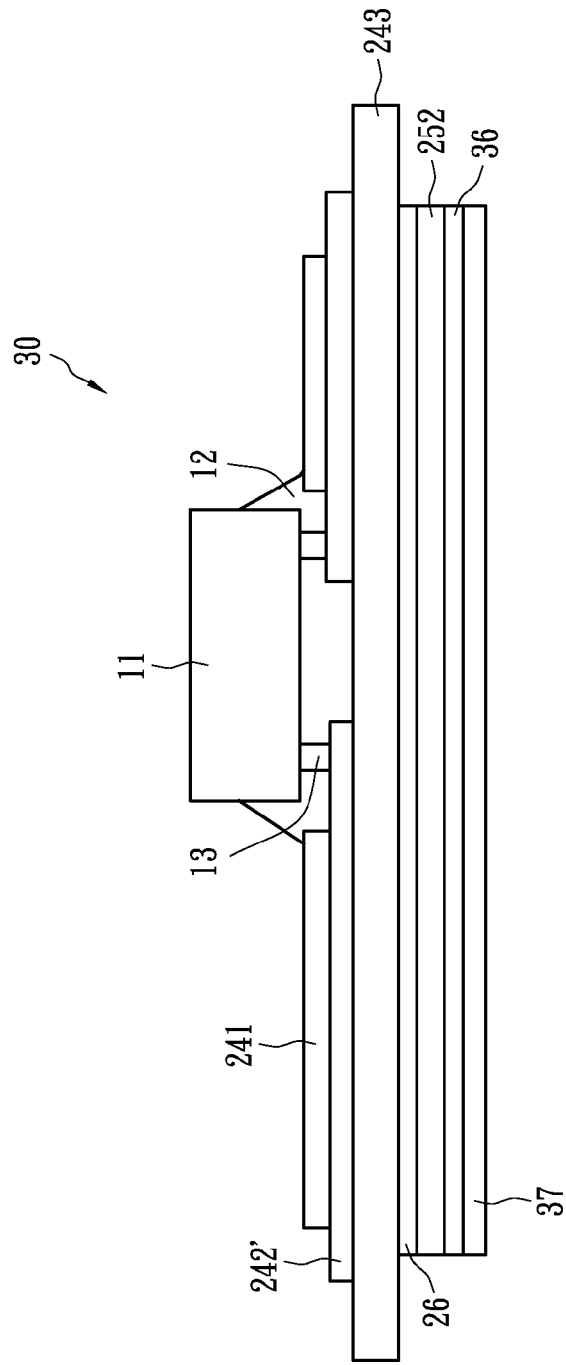
FIG. 3 is a cross-sectional diagram of a conventional LCD driver package equipped with an aluminum film as a heat sink.

The invention relates to the application of carbon nanocapsules to semiconductor packages having enhanced thermal dissipation characteristics. In particular, a dielectric material or resin is blended with a small quantity of carbon nanocapsules for use in electronic packaging applications with the purpose of improving heat dissipation of semiconductor chips. Such a mixed material or resin is directly or indirectly in contact with semiconductor chips to improve heat transfer and dissipation. The applications of the mixed material to the semiconductor packages include flip chip underfill, non-flow underfill, chip encapsulant, chip coating, die-attach adhesives, non-conductive paste/film, conductive paste/film, film-on-wire, etc.

Carbon nanocapsules have the characteristic of effectively transforming heat into infrared radiation through absorption and radiation which is the primary way for heat removal from the electrical packages. These carbon nanocapsule surfaces are further processed to ensure they are electrically insulated to prevent parasitic effects or electrical short in applications and may be optionally functionalized to achieve good interfacial adhesion between the nanocapsule particles and the base resins so that CNC can evenly be dispersed in the base resins.

A carbon nanocapsule is a polyhedral carbon cluster constituted of concentric multi-layers of closed graphitic sheet structures. The diameter of a carbon nanocapsule is between approximately 1 and 100 nm where the average diameter is 30 nm. There are two types of carbon nanocapsules: hollow and metal-filled. The center of a hollow carbon nanocapsule is a nanoscale cavity, while that of a metal-filled nanocapsule is filled with metals, metal oxides, metal carbides, or alloys.

Carbon nanocapsules were first discovered in 1991, in the process of producing carbon nanotubes. Due to the strong Van der Waals force between carbon nanocapsules and carbon nanotubes, it is not easy to isolate carbon nanocapsules from carbon nanotubes. In addition, the quantity of carbon nanocapsules produced with carbon nanotubes is sufficient only for structural observation under an electron microscope, thus the application thereof is limited.

With continuous research, processes producing high-purity hollow carbon nanocapsules as well as magnetic metal-filled carbon nanocapsules have been developed. Please further refer to U.S. Pat. No. 7,156,958, and U.S. Pat. No. 6,872,236. In addition to the chemical properties of carbon, with the special hyperfullerene structure and optoelectronic properties of carbon nanocapsules, a carbon nanocapsule thin film should be electrically and thermally conductive, anti-oxidizing, and as structurally stable as graphite; thus it is suitable for applications such as an electrically and thermally conductive film, a chemical-resistive and anti-oxidizing protective film, a carbon electrode of an ultra-thin lithium battery and others.

A dielectric resin material when mixed with carbon nanocapsules is suitable for use in electronic packaging to effectively remove heat. As the carbon nanocapsule is capable of transferring heat into infrared energy by absorption and radiation, the material is effective for heat dissipation and thus is capable of reducing the operating temperature of the electronic package. Examples of nanocapsules are shown in U.S. Pat. No. 6,841,509, US Patent Application 20060008404, and US Patent Application 20040126303. The resin material mixed with carbon nanocapsules transfer heat not only by conduction but also by radiation, so the capability of the heat dissipation of the material is effectively improved. That is, the electronic package employing the mixed resin material has better heat-dissipation capability.

Carbon nanocapsule surfaces as described above are processed to make the carbon nanocapsules substantially electrically insulated by forming electric insulating layers. Referring to U.S. Patent publication No. 20080287591, the carbon nanocapsule surface may also optionally be functionalized to achieve good interfacial adhesion between nanocapsule particles and the resins.

Figure 4A:
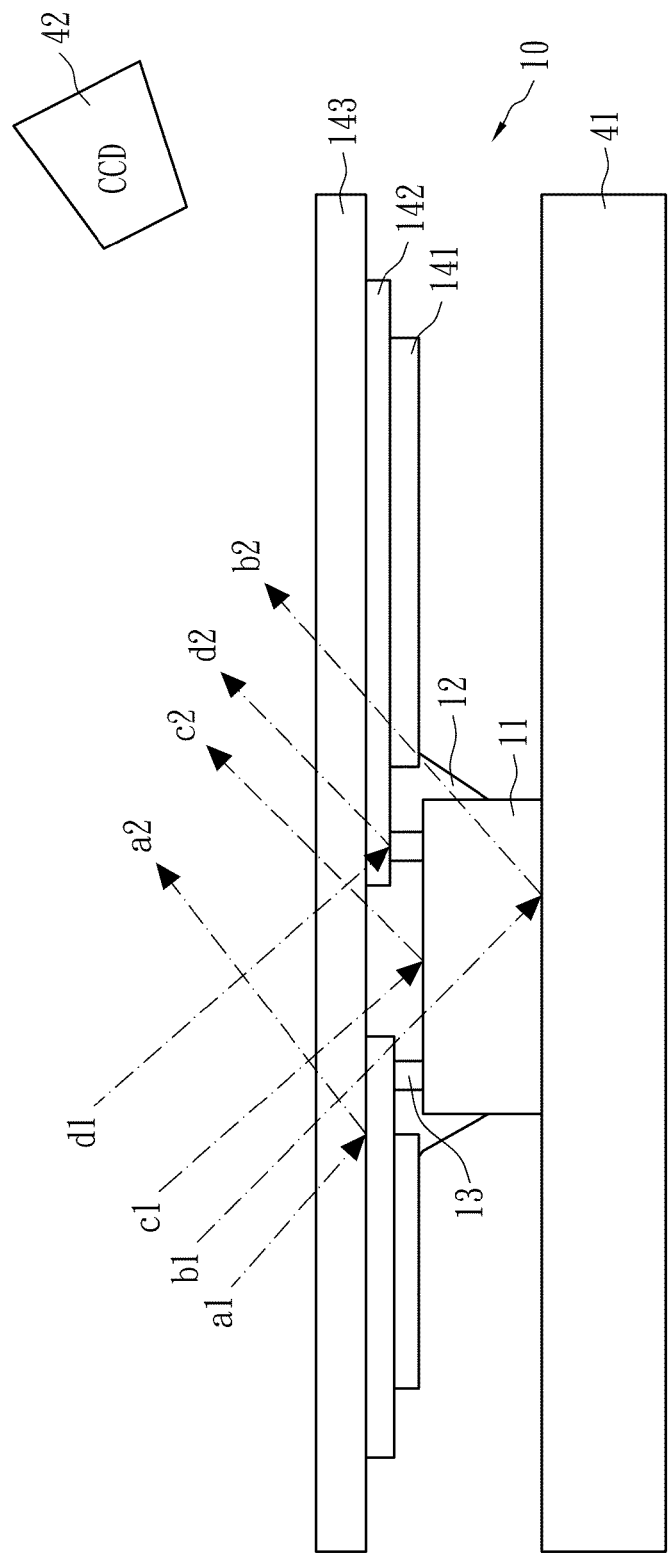
FIG. 4A shows an imaging system for capturing IR images of an LCD driver package.

As it is known that silicon material is transparent to infrared radiation, a mixture of carbon nanocapsules and resin is effective for transferring thermal energy through the body of silicon-based semiconductors. FIG. 4A shows an imaging system to capture IR images of an LCD driver package. FIGS. 4B to 4E show the IR images of the LCD driver package captured in FIG. 4A in which the driver chip (silicon chip) 11, the PI substrate 143, the insulator 12, the wiring layer 142 and the resistant 141 are all transparent to infrared radiation.

IR lights a1-d1 are incident on the LCD driver package 10 placed on a stage 41. The lights a1-d1 are radiated on and reflected from the wiring layer 142, the stage 41, the active surface of the driver chip 11, and the bumps 13 to be the reflected lights a2-d2 radiating towards a CCD camera 42. The CCD camera 42 can capture the images of the LCD driver package 10. Please note the directions of the reflected lights a1-d1, a2-d2 shown in FIG. 4A are illustrative only.

Figure 4E:
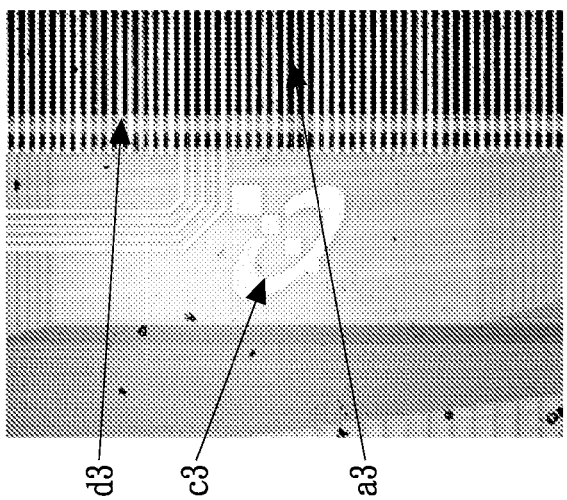
FIGS. 4B to 4E show the IR images of the LCD driver package captured in FIG. 4A.
Figure 4D:
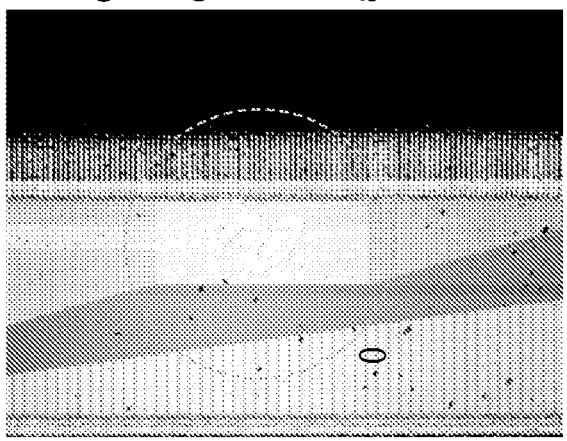
Figure 4C:
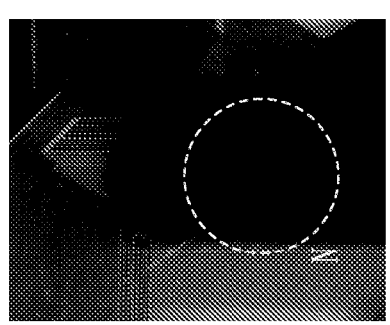
Figure 4B:
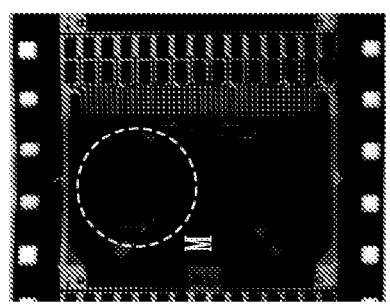

FIG. 4B shows the complete image of an LCD driver package, and FIG. 4C shows the enlarged image of the portion M in FIG. 4B. FIG. 4D also shows the enlarged image of the portion N in FIG. 4C, and the Applicant's logo on the driver chip 11 can clearly be seen. FIG. 4E shows the enlarged image of the portion O in FIG. 4D, and the images of the parts (a3, c3, d3) formed by the reflected lights (a2, c2, d2) clearly demonstrate the specified configurations including inner leads, the applicant's logo, and bumps, respectively.

Figure 4F:
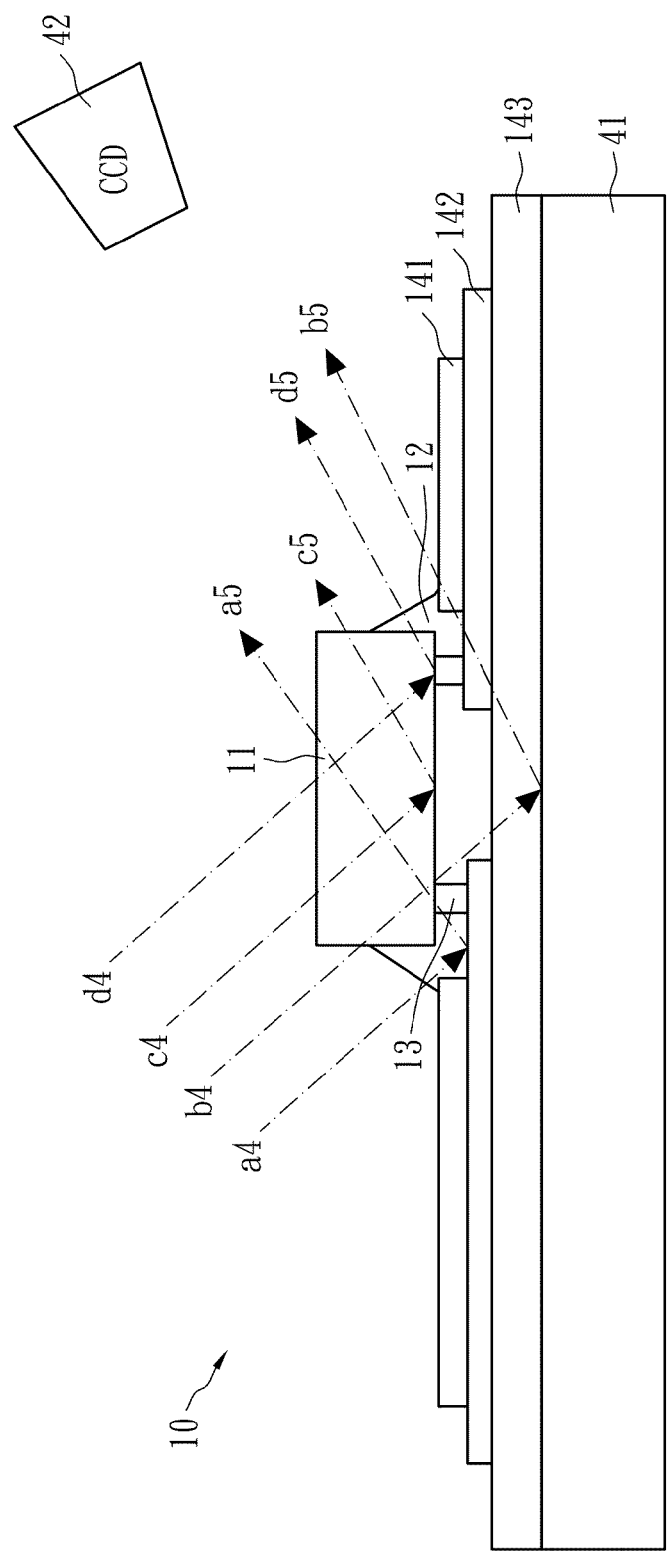
FIG. 4F shows another imaging system to capture IR images of an LCD driver package.

FIG. 4F shows another imaging system to capture IR images of an LCD driver package. FIGS. 4G to 4L show the IR images of the LCD driver package captured in FIG. 4F in which the driver chip (silicon chip) 11, the PI substrate 143, the insulator 12, the wiring layer 142 and the resistant 141 are all transparent to infrared radiation. The driver chip 11 of the LCD driver package 10 in FIG. 4F directly faces the IR light, but the PI substrate 143 of the LCD driver package 10 in FIG. 4A directly faces the IR light.

IR light a4-d4 are incident on the LCD driver package 10 placed on a stage 41. The lights a4-d4 are radiated on and reflected from the wiring layer 142, the stage 41, the active surface of the driver chip 11, and the bumps 13 to be the reflected lights a5-d5 radiating towards a CCD camera 42. The CCD camera 42 can capture the images of the LCD driver package 10.

Figure 4I:
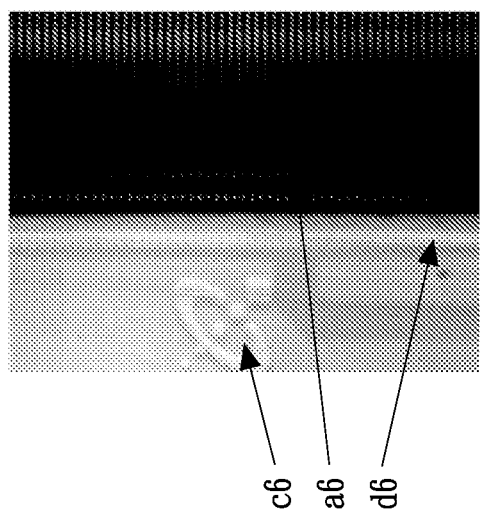
Figure 4L:
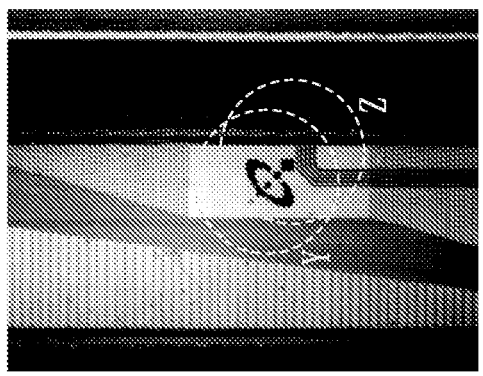
Figure 4H:
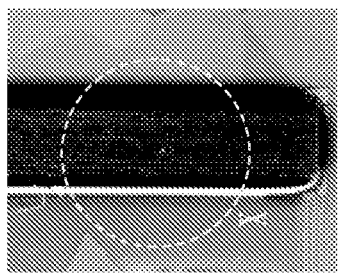
Figure 4G:
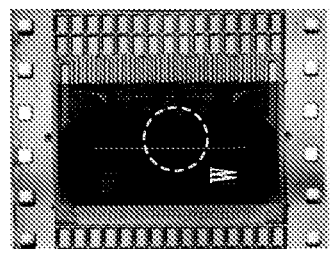
Figure 4J:
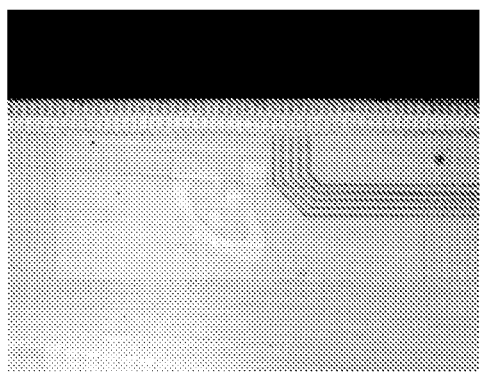

FIG. 4G shows the complete image of an LCD driver package, and FIG. 4H shows the enlarged image of the portion W in FIG. 4G. FIG. 4I also shows the enlarged image of the portion X in FIG. 4H, and the Applicant's logo on the driver chip 11 can be seen. FIG. 4J shows the enlarged image of the portion Y in FIG. 4D. FIG. 4J shows the enlarged image of the portion Z in FIG. 4D, and the parts (a6, c6, d6) of the images formed by the reflecting lights (a5, c5, d5) clearly demonstrate the specified configurations including the inner leads 142, the applicant's logo, and bumps 13, respectively.

Therefore, the aforesaid mixture is suitable for use in direct contact with a functional silicon die in a semiconductor package. Compared to the usage of conventional heat conduction and convention for semiconductor package heat dissipation, additional paths of transferring heat using infrared radiation through the body of silicon chips make thermal energy removal much more efficient. Materials for such applications include encapsulant, flip-chip underfill, and coatings. The above mixture is also suitable for various die attach adhesive applications for use in attaching a die onto a substrate (rigid or flexible) or for die stacking. These adhesives include products commonly known in the field such as screen-on die attach paste, die attach film (DAF), film over wire (FOW) and non-conducting paste (NCP).

Figure 5A:
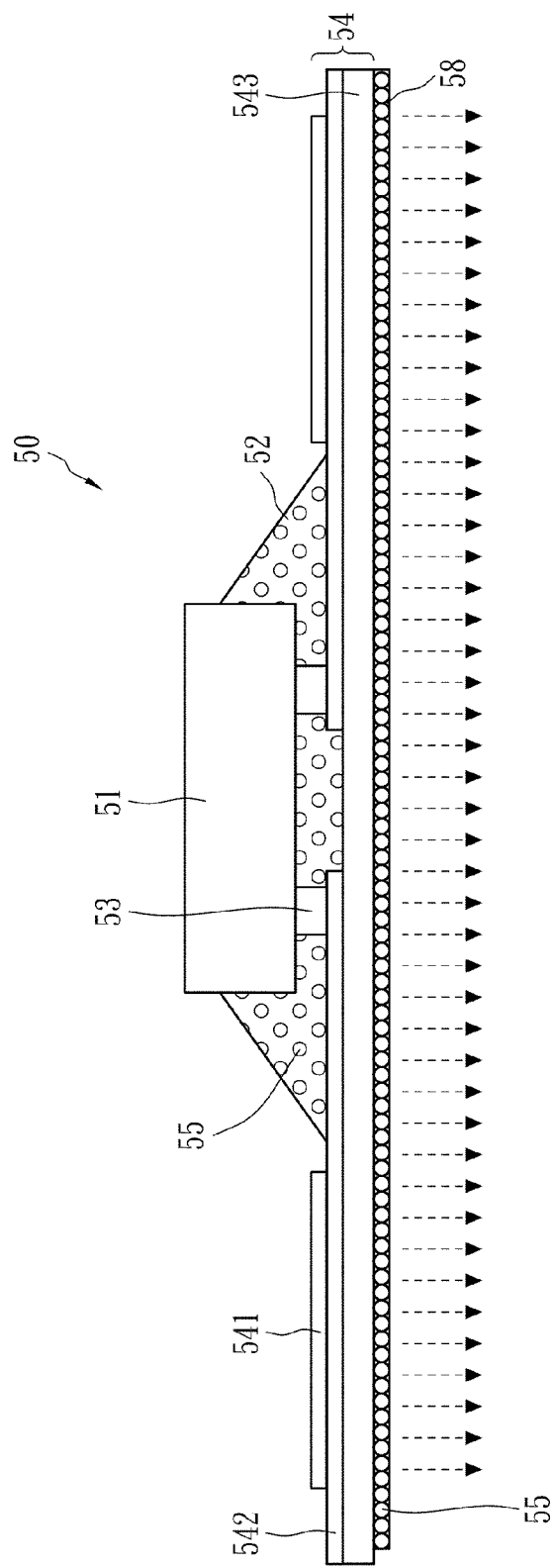
FIGS. 5A to 5C show cross-section diagrams of LCD driver packages in accordance with the present invention.

FIG. 5A shows a cross-section diagram of a LCD driver package in accordance with the present invention. The LCD driver package 50 comprises a driver chip 51 and a tape carrier 54. Moreover, the tape carrier 54 includes a polyimide (PI) substrate 543, a wiring layer (or copper foil) 542 formed on the substrate 543, and a resistant (solder mask) 541 overlaying the wiring layer 542. The driver chip 51 is mounted on the tape carrier 54 by flip-chip bonding. The bumps 53 formed on the driver chip 51 are connected to the wiring layer 542 of the tape carrier 54. An insulator (or resin) 52 is filled with the gap between the driver chip 51 and a tape carrier 54 to protect the bumps 53 and inner leads of the wiring layer 542.

Carbon nanocapsules 55 are evenly mixed in the insulator 52, so the heat generated from the driver chip 51 can be effectively transferred by the carbon nanocapsules 55 in a thermal radiation manner. Furthermore, the carbon nanocapsules 55 evenly mixed in an adhesive 58 are also coated on the substrate 543.

Figure 5B:
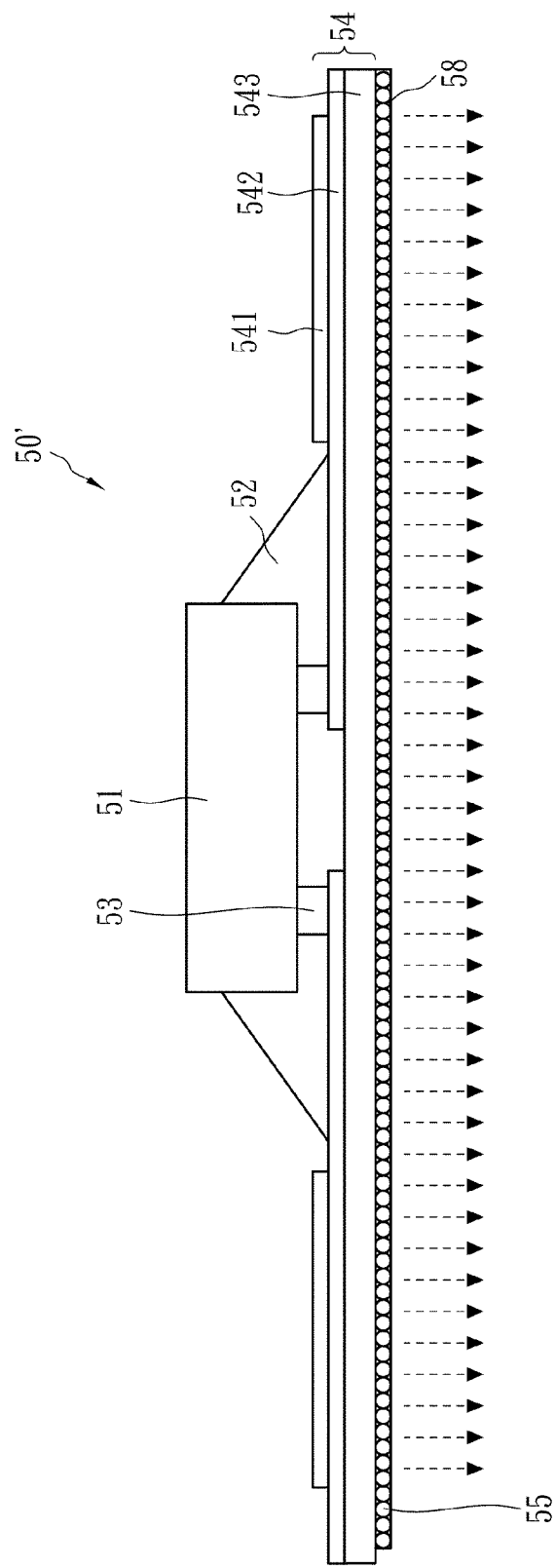

Compared with the LCD driver package 50 in FIG. 5A, the carbon nanocapsules 55 are not mixed in the insulator 52 of the LCD driver package 50' in FIG. 5B, but are also evenly mixed in the adhesive 58 and coated on the PI substrate 543. Heat is acceleratively emitted along the arrows towards the environments because the carbon nanocapsules 55 help to remove the heat accumulated in the PI substrate 543.

Figure 5C:
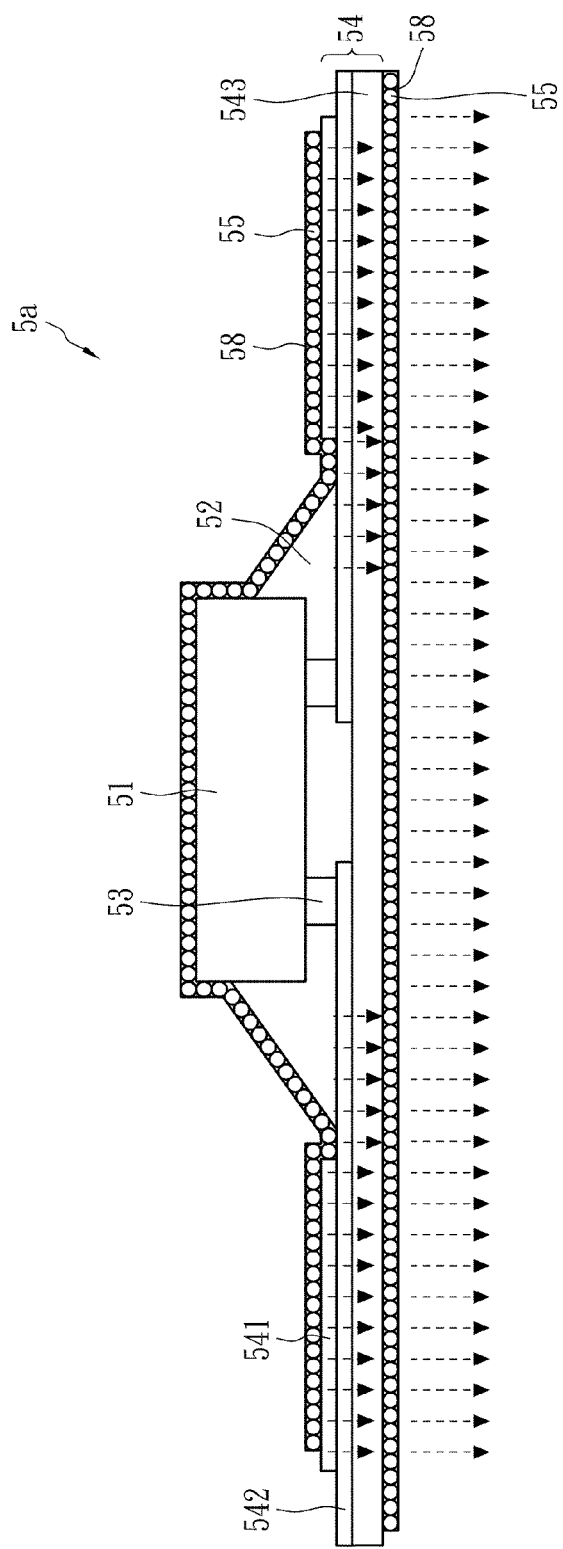

As shown in FIG. 5C, the carbon nanocapsules 55 mixed in the adhesive 58 are further coated on the upper surfaces of the driver chip 51 (a passive surface of the driver chip 51), the insulator 52, the resistant 541, and the wiring layer 542. So, the heat generated from the driver chip 51 can be further transferred to the side of the PI substrate 543 in an infrared radiation way.

Figure 6A:
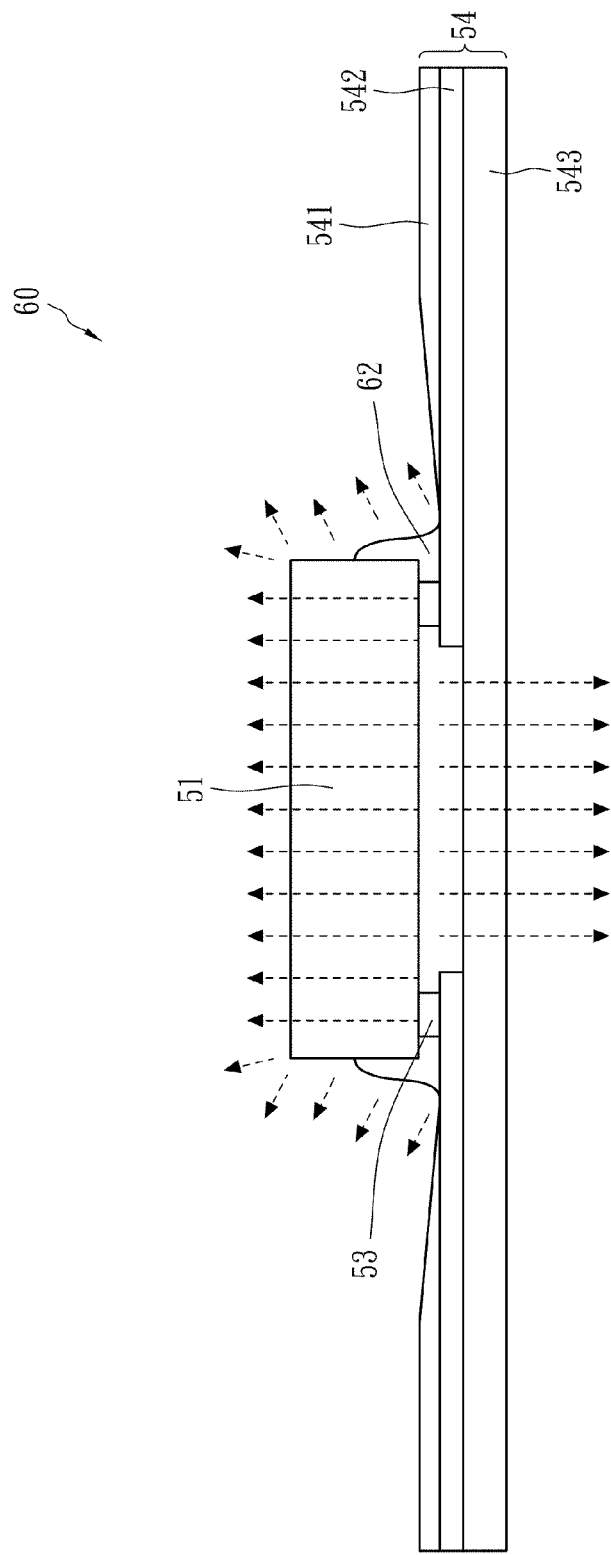
FIGS. 6A to 6B show cross-section diagrams of LCD driver packages in accordance with the present invention.
Figure 6B:
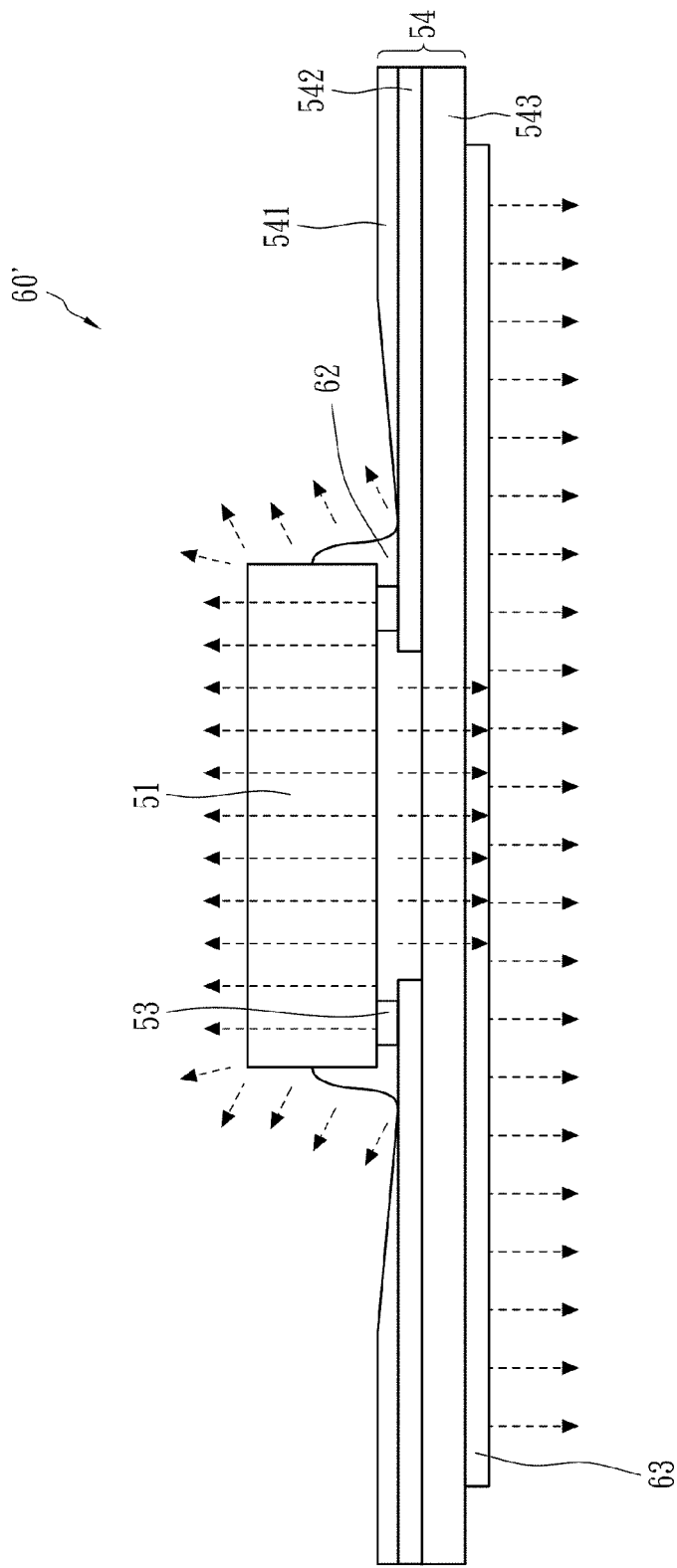

FIG. 6A shows an LCD driver package 60 having resin 62 mixed with carbon nanocapsules between the driver chip 51 and the tape carrier 54 so the heat generated from the driver chip 51 acceleratively emitted along the arrows towards the environments. FIG. 6B shows an LCD driver package 60' having resin 62 mixed with carbon nanocapsules and a coating layer 63 with carbon nanocapsules on the PI substrate 543 so the heat generated from the driver chip 51 acceleratively emitted along the upward and downward arrows towards the environments.

Figure 7A:
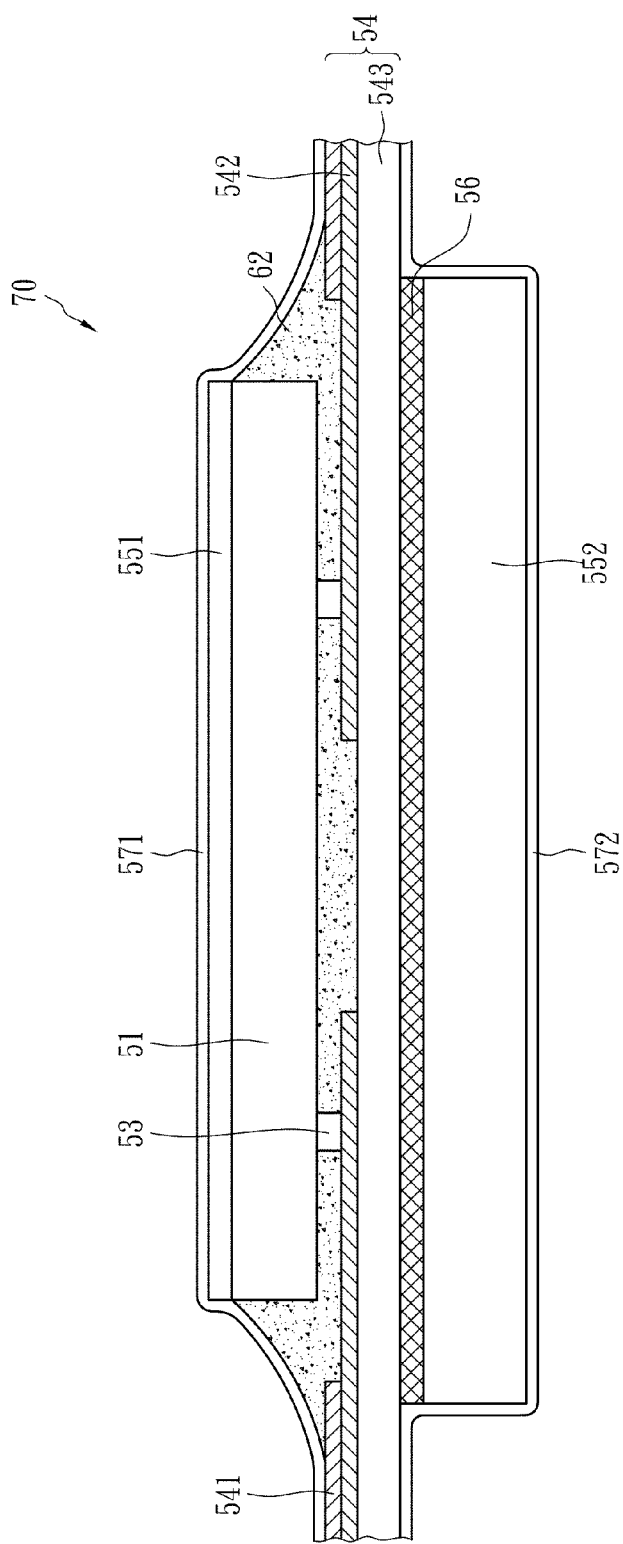
FIGS. 7A to 7G show cross-section diagrams of LCD driver packages with heat sinks in accordance with the present invention.
Figure 7B:
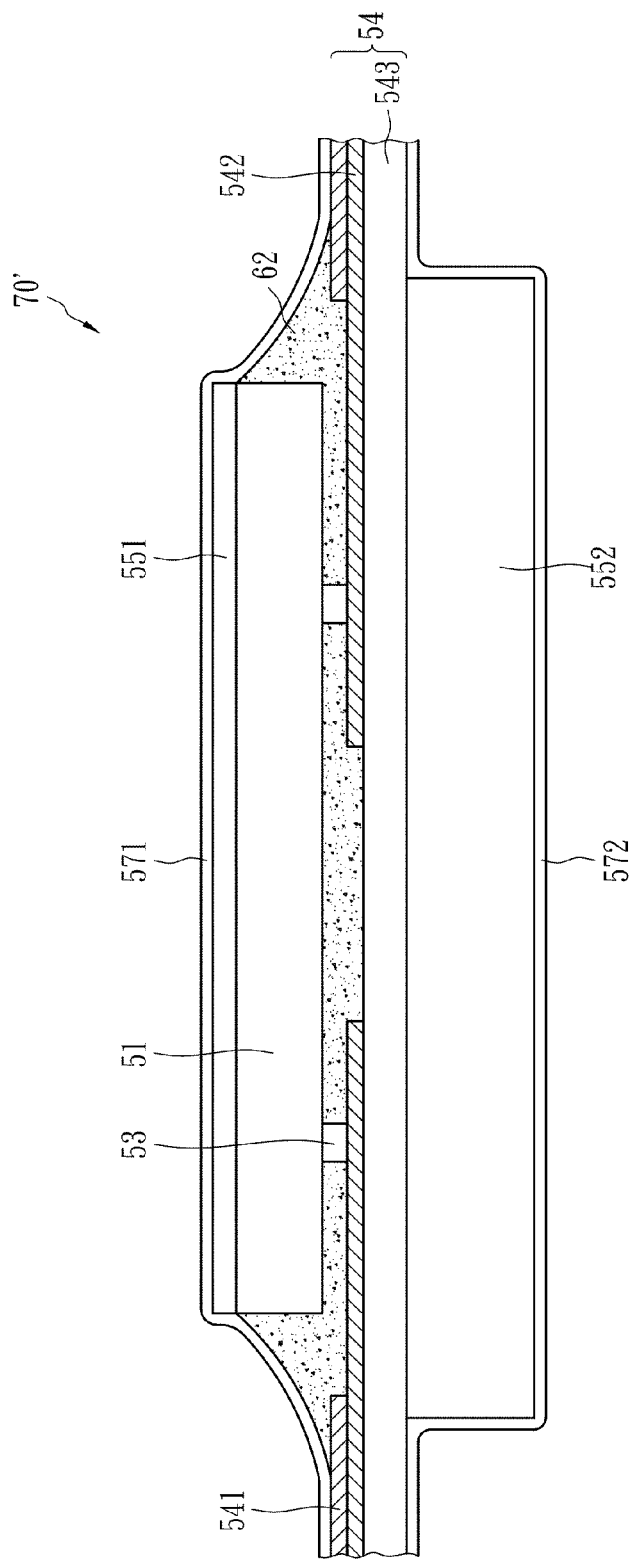
Figure 7C:
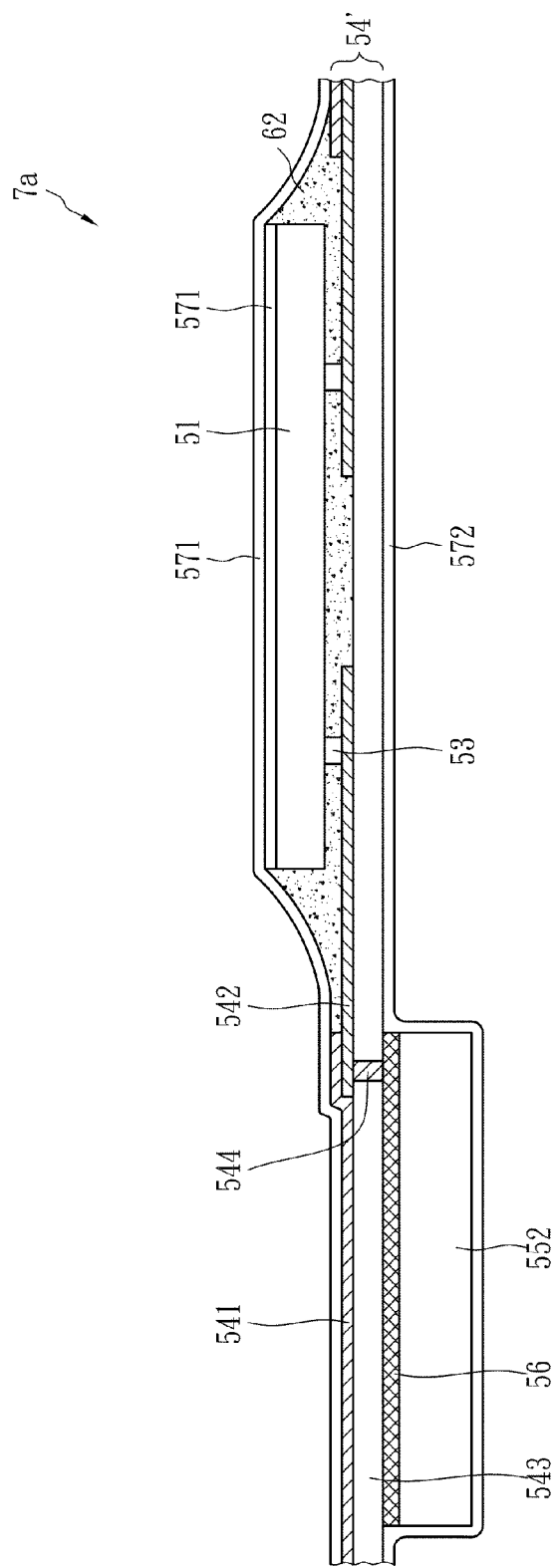

FIGS. 7A-7C show cross-section diagrams of LCD driver packages with heat sinks in accordance with the present invention. The LCD driver package 70 further comprises a first heat sink 551 and a second heat sink 552. The first heat sink 551 is attached to the passive surface of the driver chip 51, and the second heat sink 552 is adhered to the substrate 543 by thermally conductive adhesive 56. To improve the thermal dissipation, a first coating layer 571 with carbon nanocapsules overlays the upper surfaces of the first heat sink 551, the insulator 62, the resistant 541, and the wiring layer 542, and a second coating layer 572 with carbon nanocapsules overlays the surfaces of the PI substrate 543 and the second heat sink 552. So, the heat generated from the driver chip 51 is acceleratively emitted upwards and downwards towards the environments.

By contrast, the second heat sink 552 of the LCD driver package 70' is directly attached to the substrate 543, as shown in FIG. 7B. Compared with FIG. 7A, the LCD driver package 7a in FIG. 7C also has two heat sinks (551, 552), but the second heat sink 552 is not underneath the driver chip 51. To improve the thermal dissipation, conductive columns 544 connect the wiring layer 542 and the adhesive 56 through the substrate 543 of the tape carrier 54'. A first coating layer 571 with carbon nanocapsules and a second coating layer 572 with carbon nanocapsules respectively cover the upper surface and the lower surface of the LCD driver package 7a.

Figure 7D:
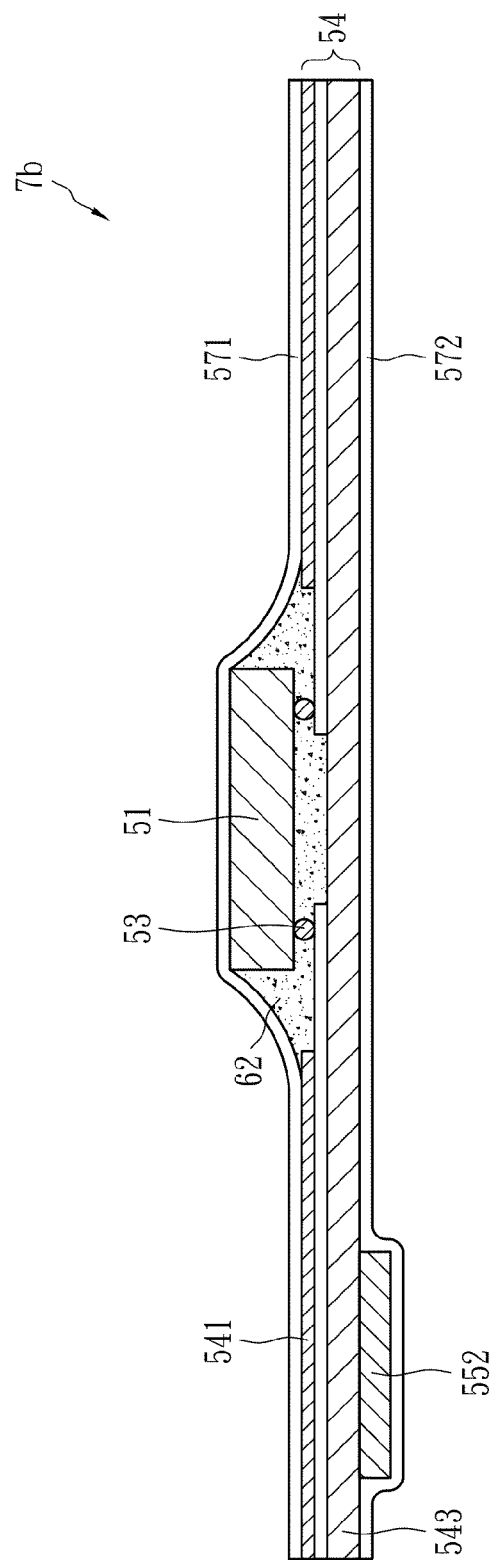
Figure 7E:
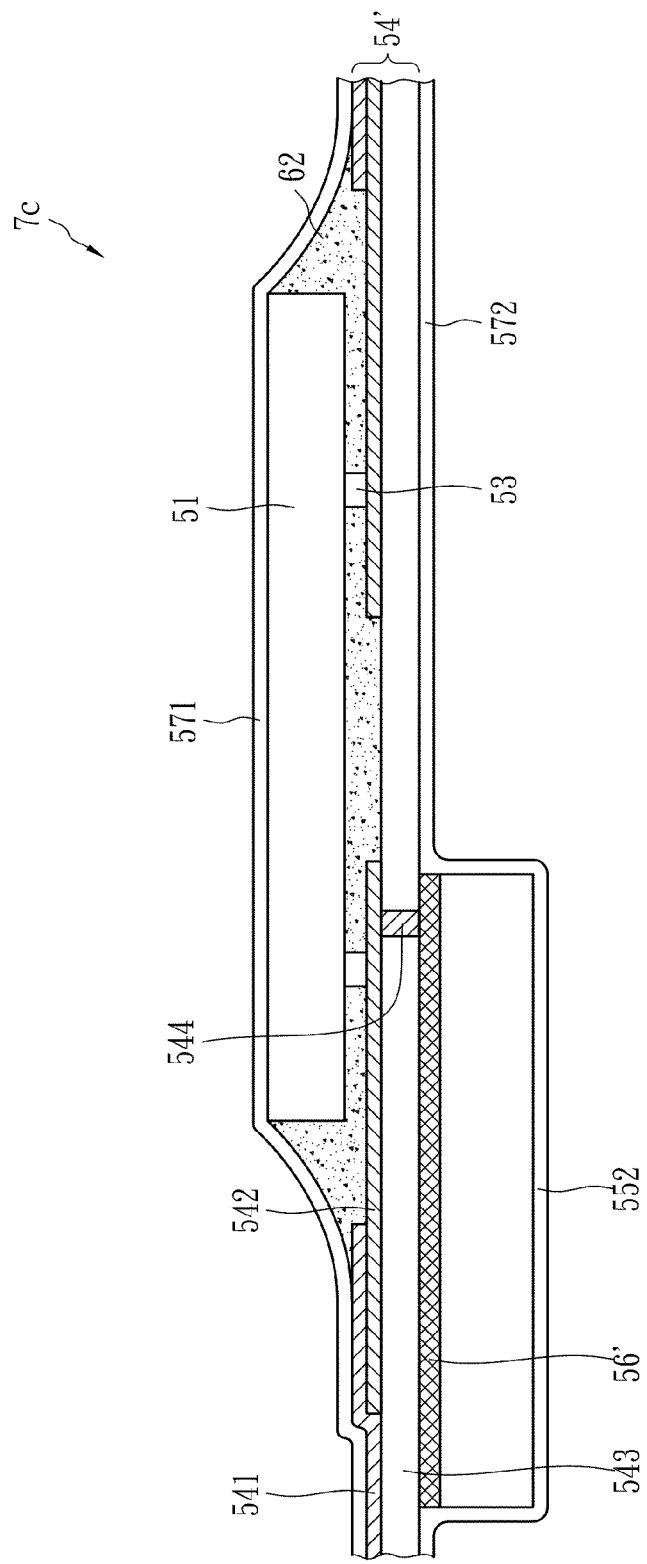
Figure 7F:
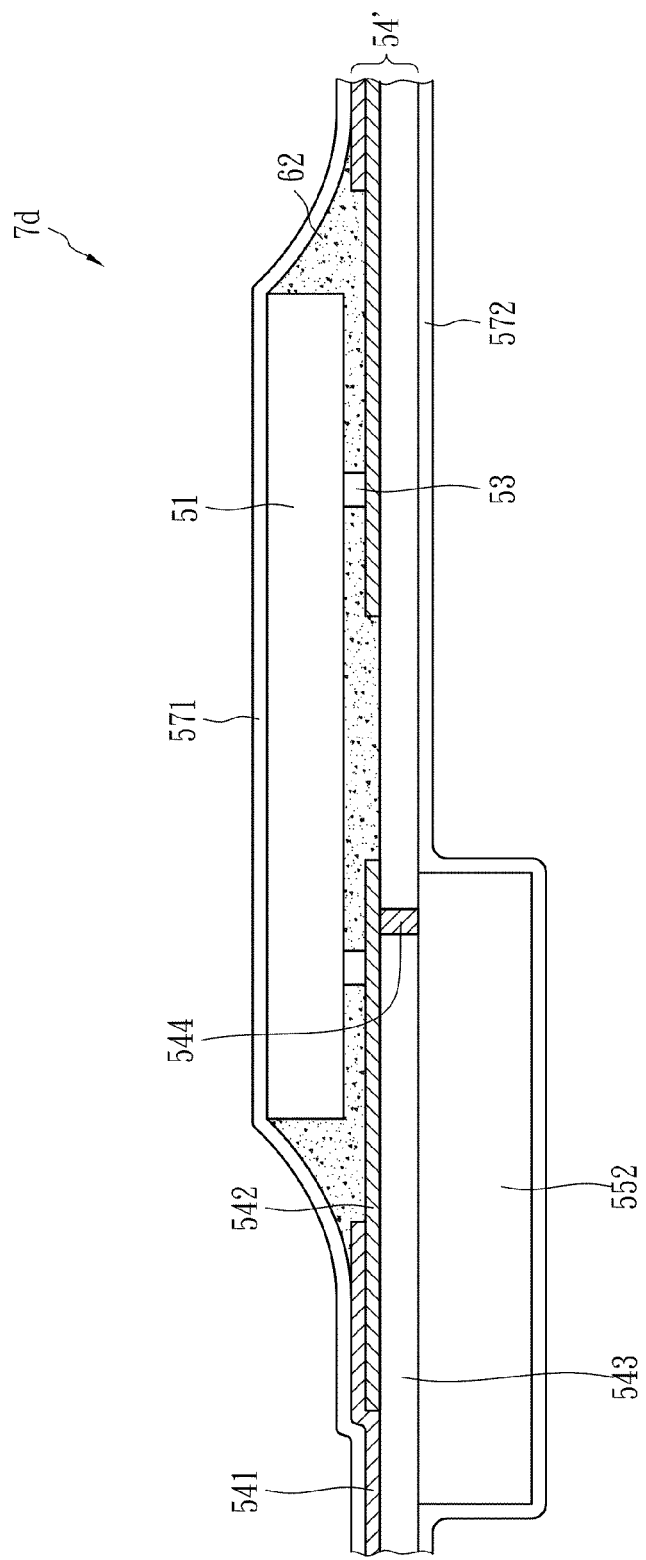

The LCD driver package 7b in FIG. 7D has only the second heat sink 552 which is directly attached to the substrate 543. Compared with FIG. 7C, the adhesive 56' mixed with carbon nanocapsules can further improve the thermal dissipation of the LCD driver package 7c in FIG. 7E. As shown in FIG. 7F, the second heat sink 552 of the LCD driver package 7d is directly attached to the substrate 543. To improve the thermal dissipation, conductive columns 544 connect the wiring layer 542 through the substrate 543 of the tape carrier 54'.

Figure 7G:
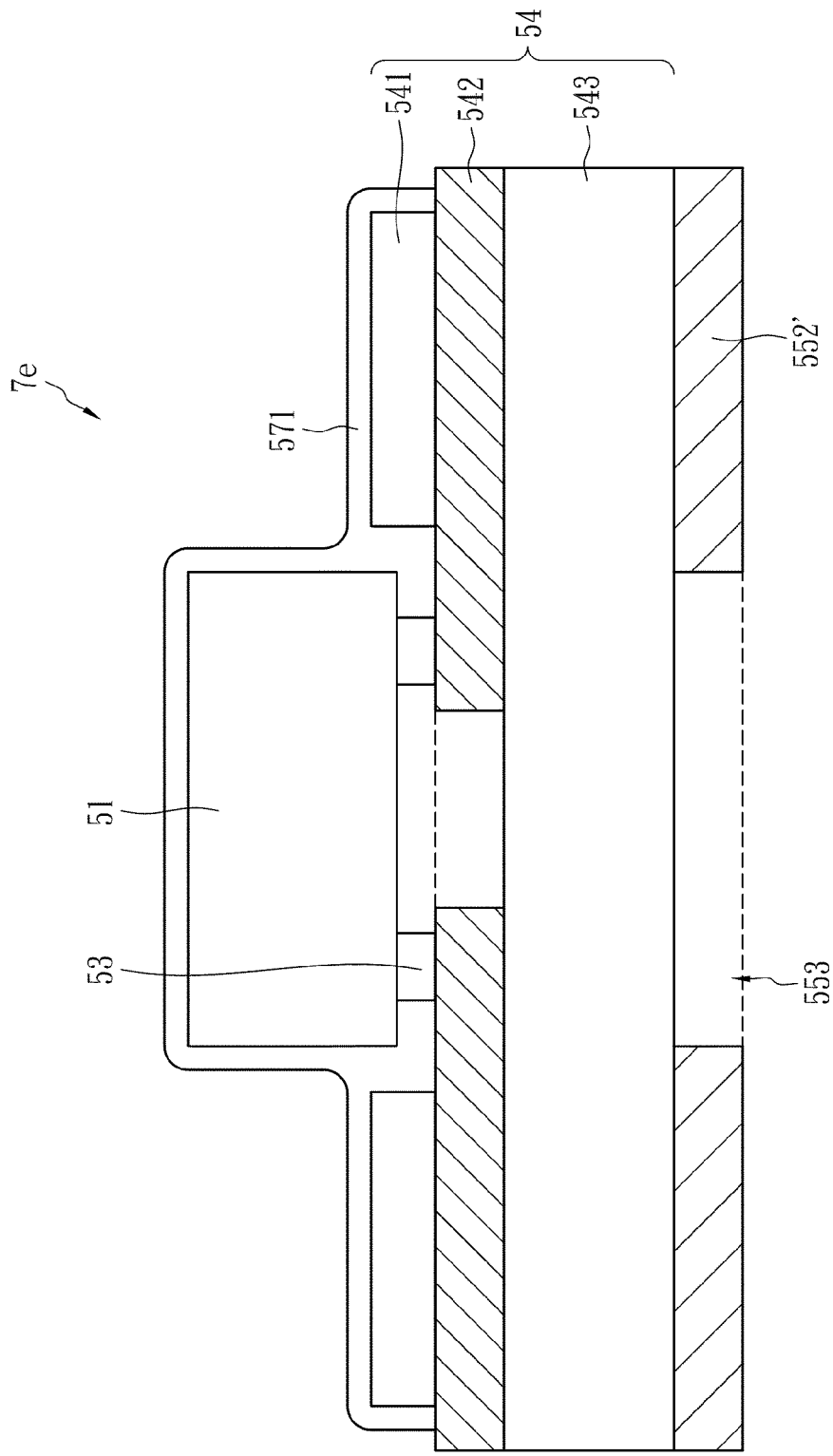

The second heat sink 552' of the LCD driver package 7e in FIG. 7G is underneath the driver chip 51, and has an opening 553 aligned with the driver chip 51.

The second heat sink (552 or 552') can be directly formed by etching whole copper foil on the PI substrate 543, or is a prefabricated piece and attached to the PI substrate 543.

Figure 8A:
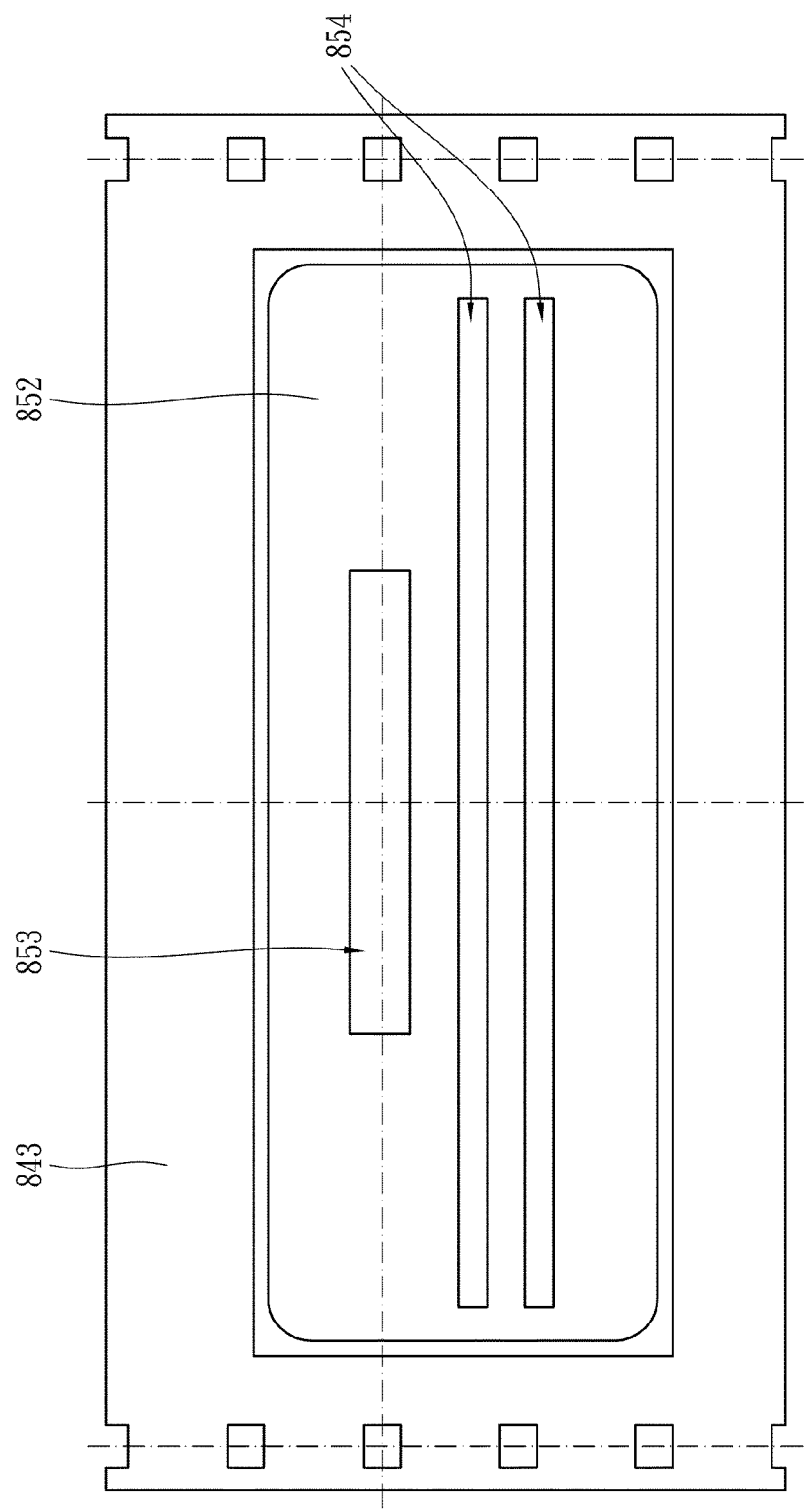
FIGS. 8A to 8C shows the combination of a heat sink and a tape carrier in accordance with the present invention.
Figure 8B:
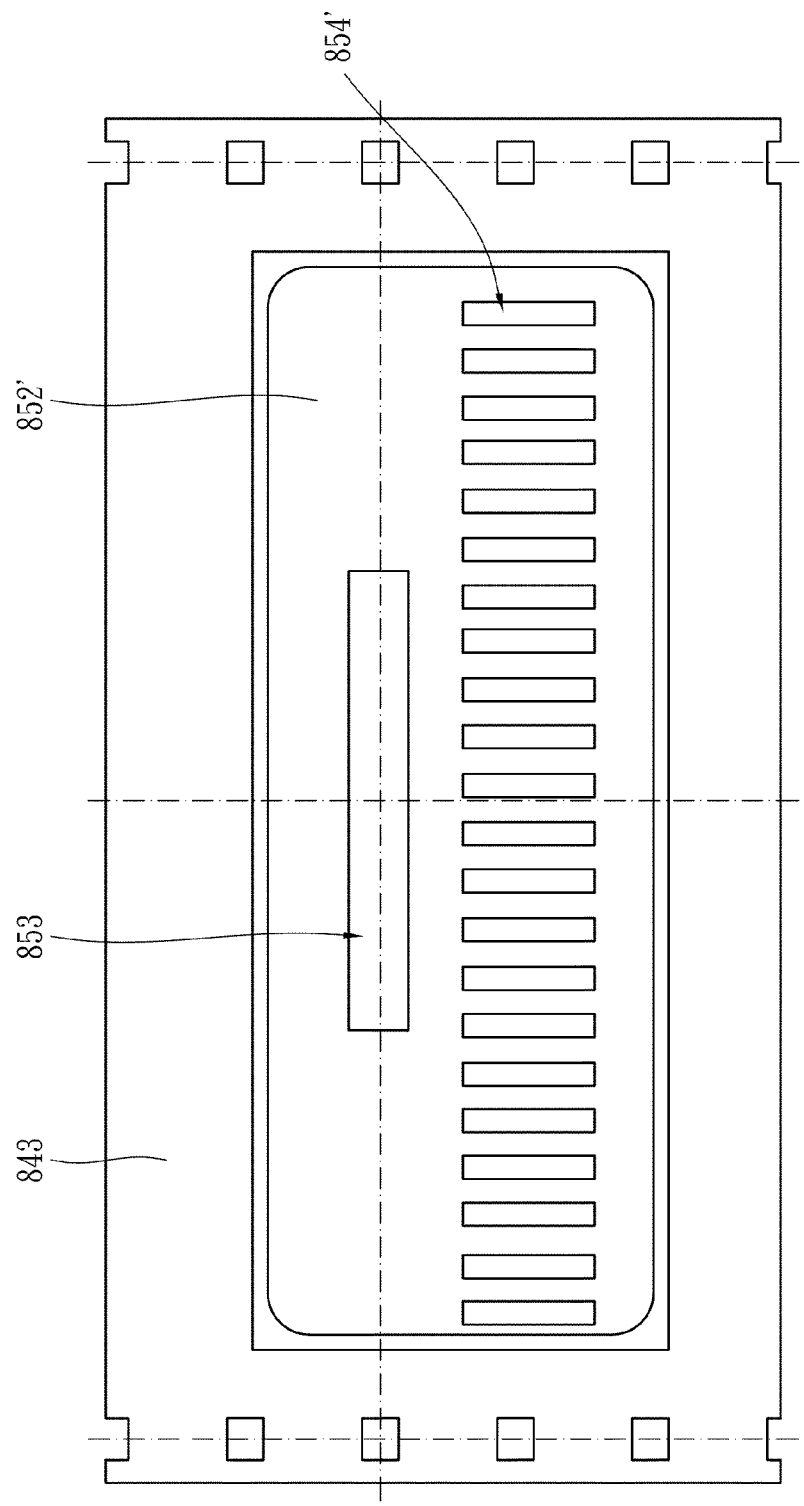
Figure 8C:
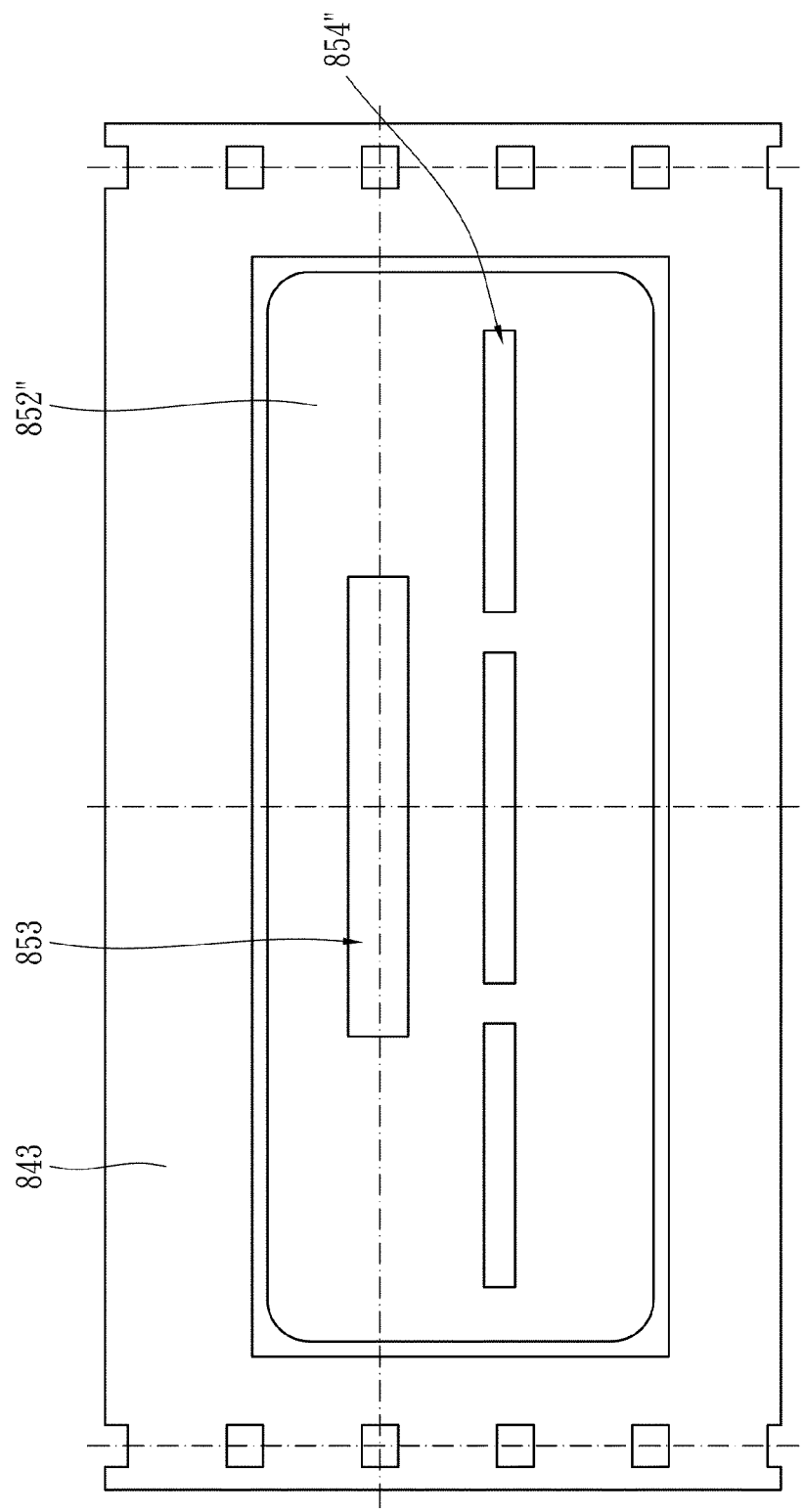

FIG. 8A shows the combination of a heat sink and a tape carrier in accordance with the present invention. The heat sink 852 has an opening 853 and a plurality of slots 854 along the transversal direction of the film 843. The heat sink 852 is adhered to the film 843. The slots 854 can help the heat sink 852 to be bent. Similarly, the heat sink 852' in FIG. 8B also has an opening 853 and a plurality of slots 854' along the lengthwise direction of the film 843. The heat sink 852" in FIG. 8C has three slots 854" aligned in a line along the transversal direction of the film 843.

Each of FIGS. 9A-9E shows an LCD driver package mounted on an LCD panel in accordance with the present invention. One side of the LCD driver package 90 is connected to the TFT substrate 911 of the LCD panel 91, and another side of the LCD driver package 90 is connected to a driving PCB 92. The LCD panel 91 further comprises a filter substrate 912 disposed on the TFT substrate 911. The first coating layer 571 of carbon nanocapsules and the second coating layer 572 of carbon nanocapsules cover the LCD driver package 90 so the heat generated from the driver chip 51 is acceleratively emitted outwards towards the environments. Furthermore, the resin 62 with carbon nanocapsules directly contacts the driver chip 51, and can transfer the heat to the first coating layer 571 and the second coating layer 572.

Figure 9A:
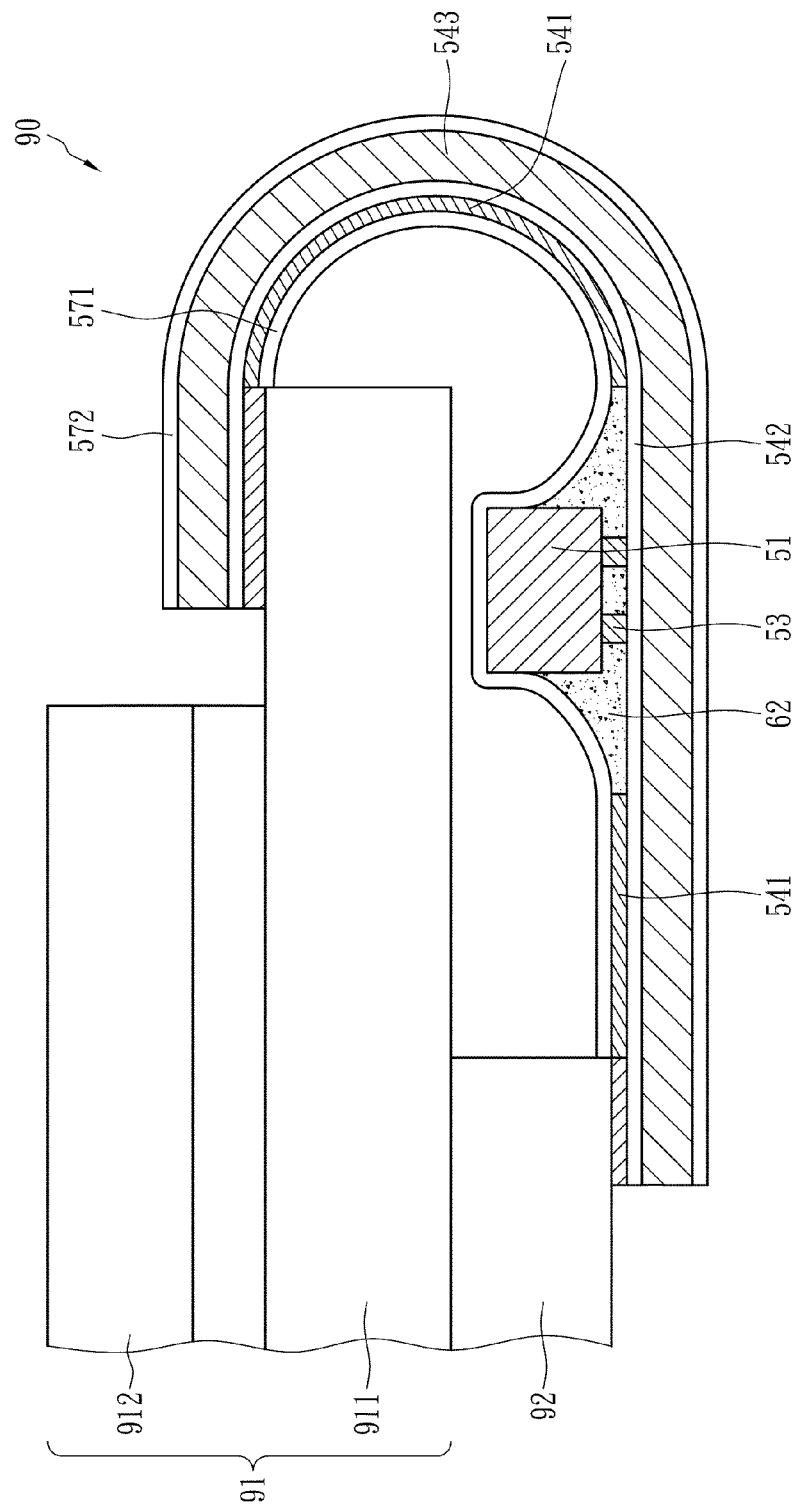
FIGS. 9A-9E show an LCD driver package mounted on an LCD panel in accordance with the present invention.
Figure 9B:
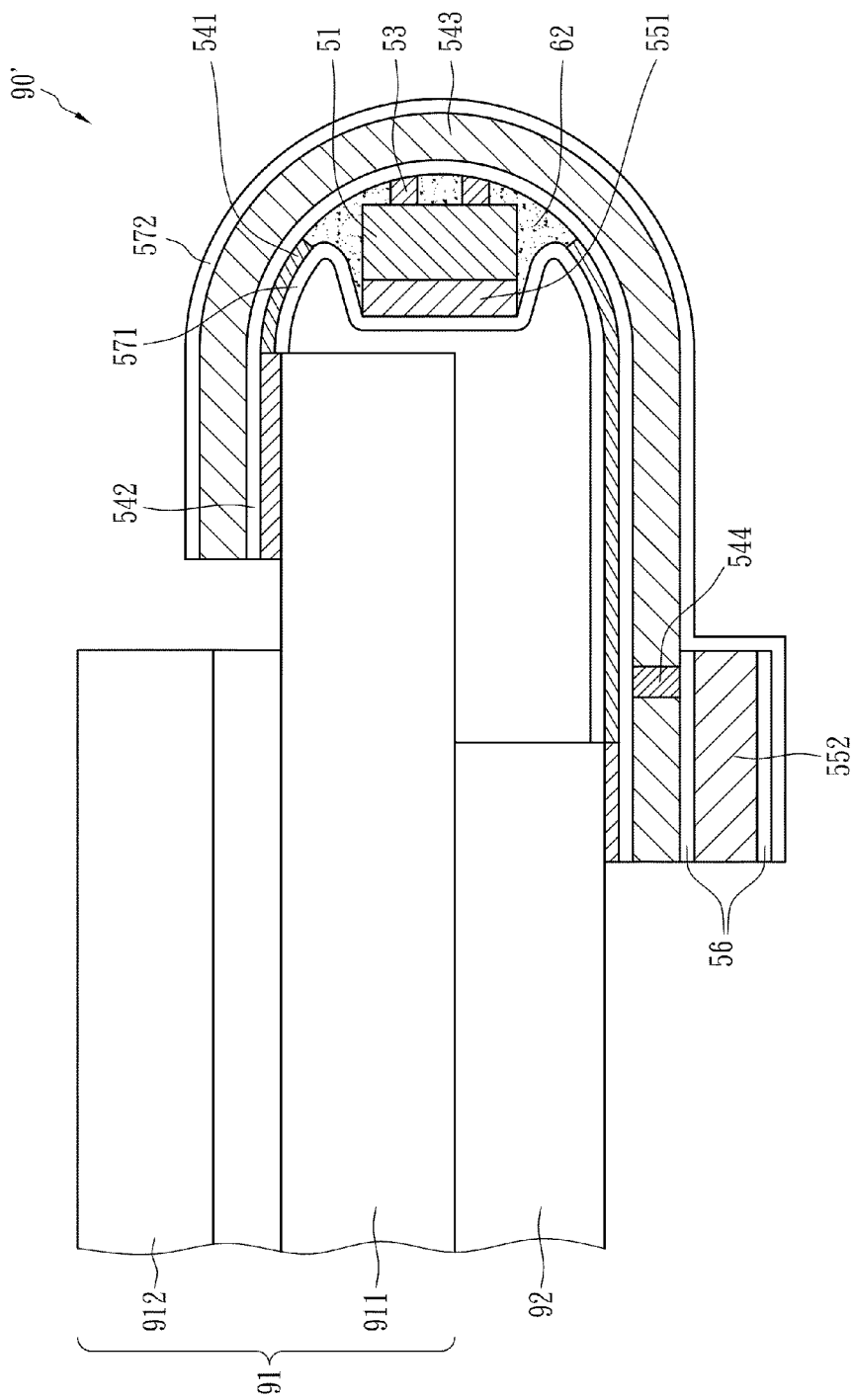

Similarly, the LCD driver package 90' in FIG. 9B further comprises the first heat sink 551 adhered to the driver chip 51 and the second heat sink 552 adhered to the PI substrate 543 by the adhesive 56. So, the heat can be effectively transferred to the second coating layer 572 through the second heat sink 552, the conductive columns 544, and the wiring layer 542.

Figure 9C:
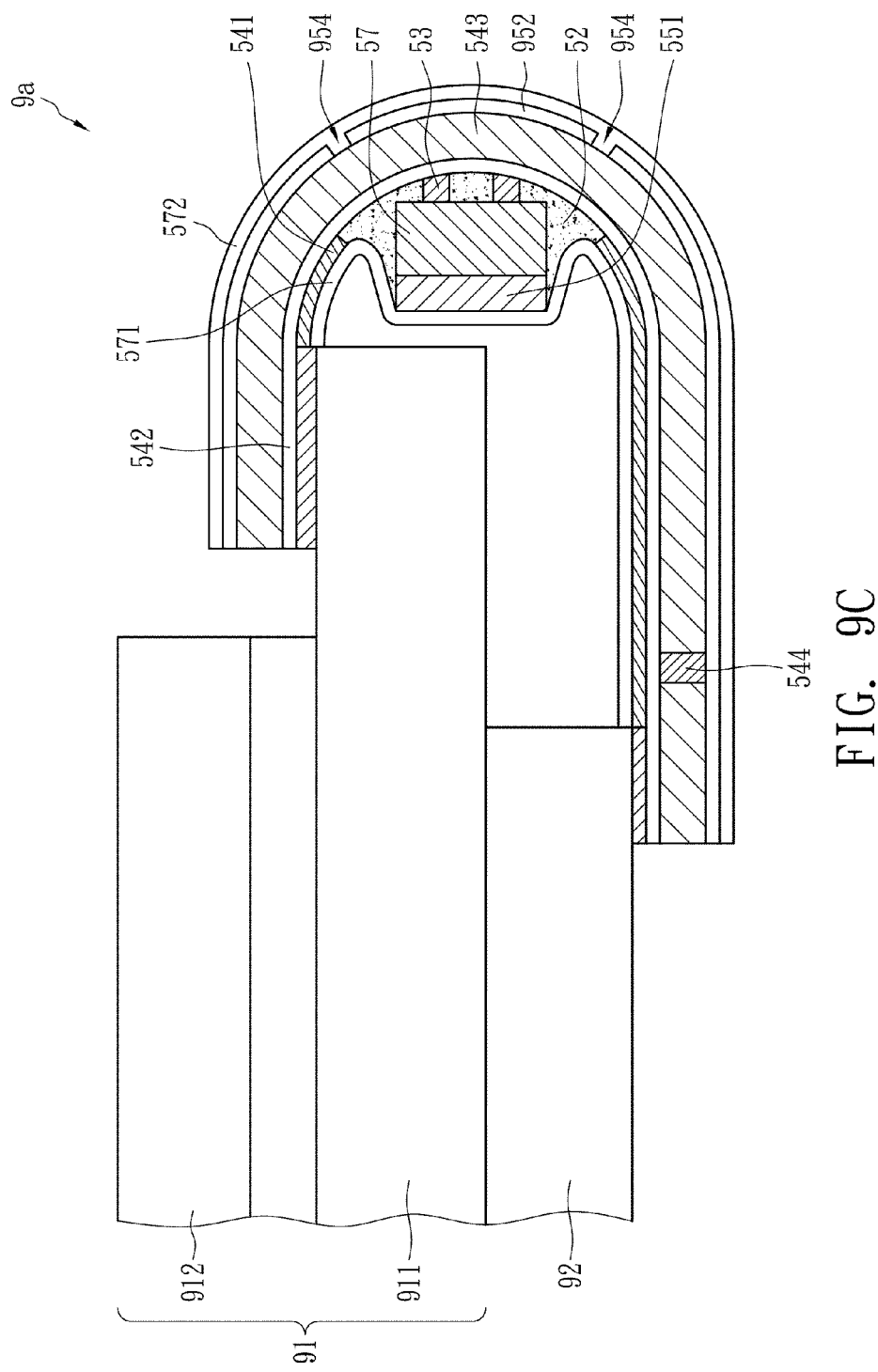
Figure 9D:
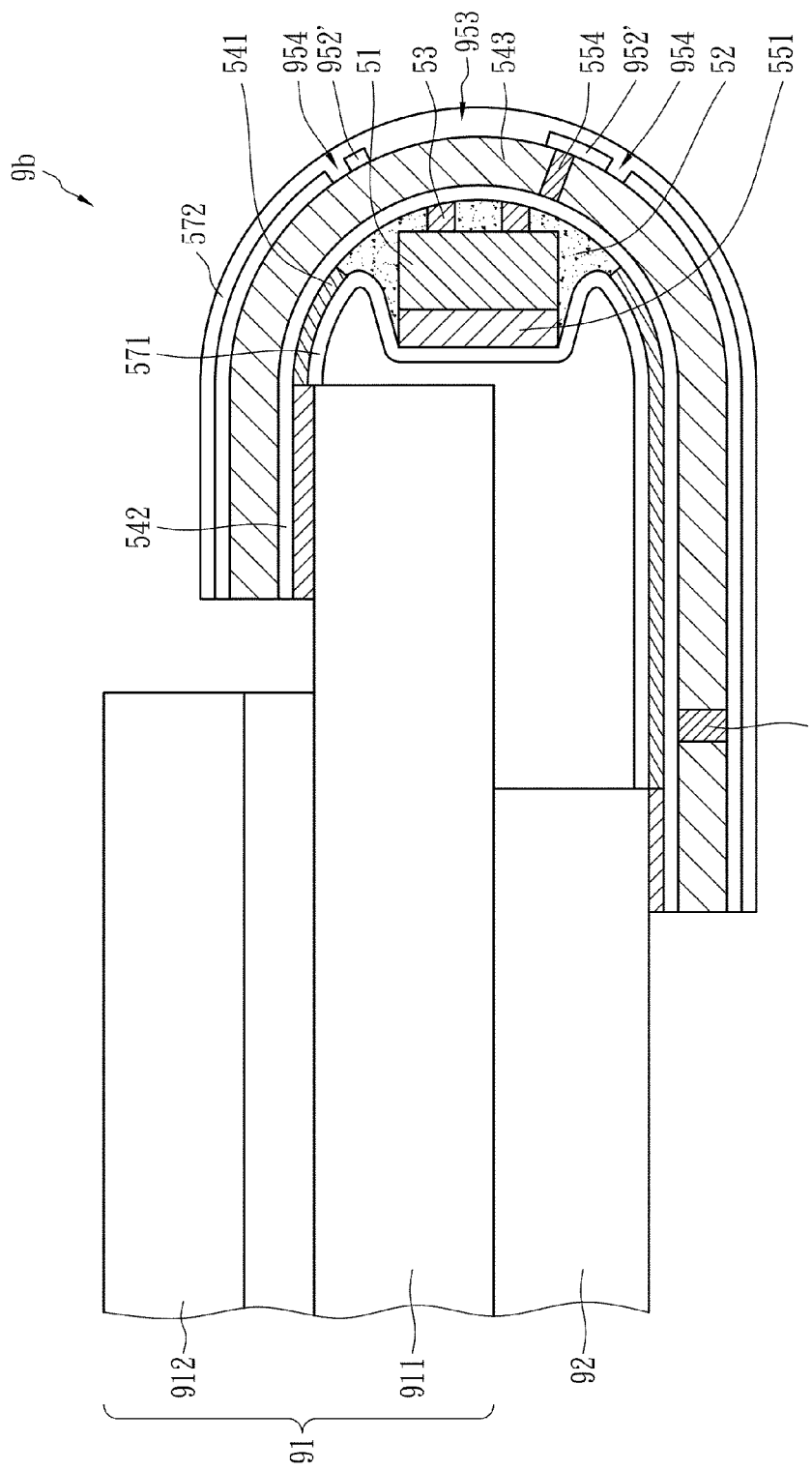
Figure 9E:
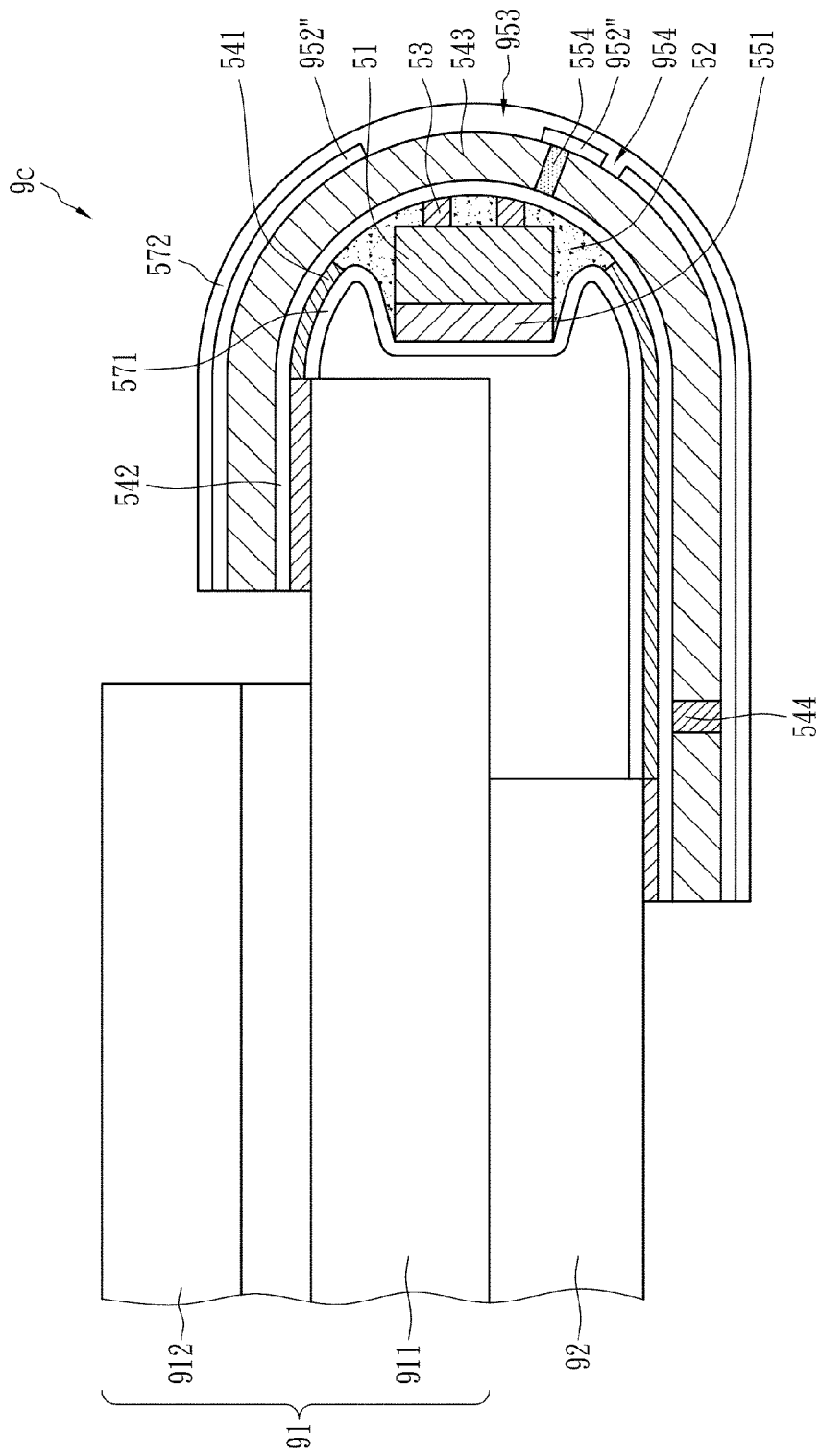

As shown in FIG. 9C, the LCD driver package 9a comprises a second heat sink 952 adhered to the PI substrate 543. The second heat sink 952 has two slots 954. The second heat sink 952' of the LCD driver package 9b in FIG. 9D further has an opening 953. By contrast, the second heat sink 952" of the LCD driver package 9c in FIG. 9E has an opening 953 and a slot 954.

Figure 10:
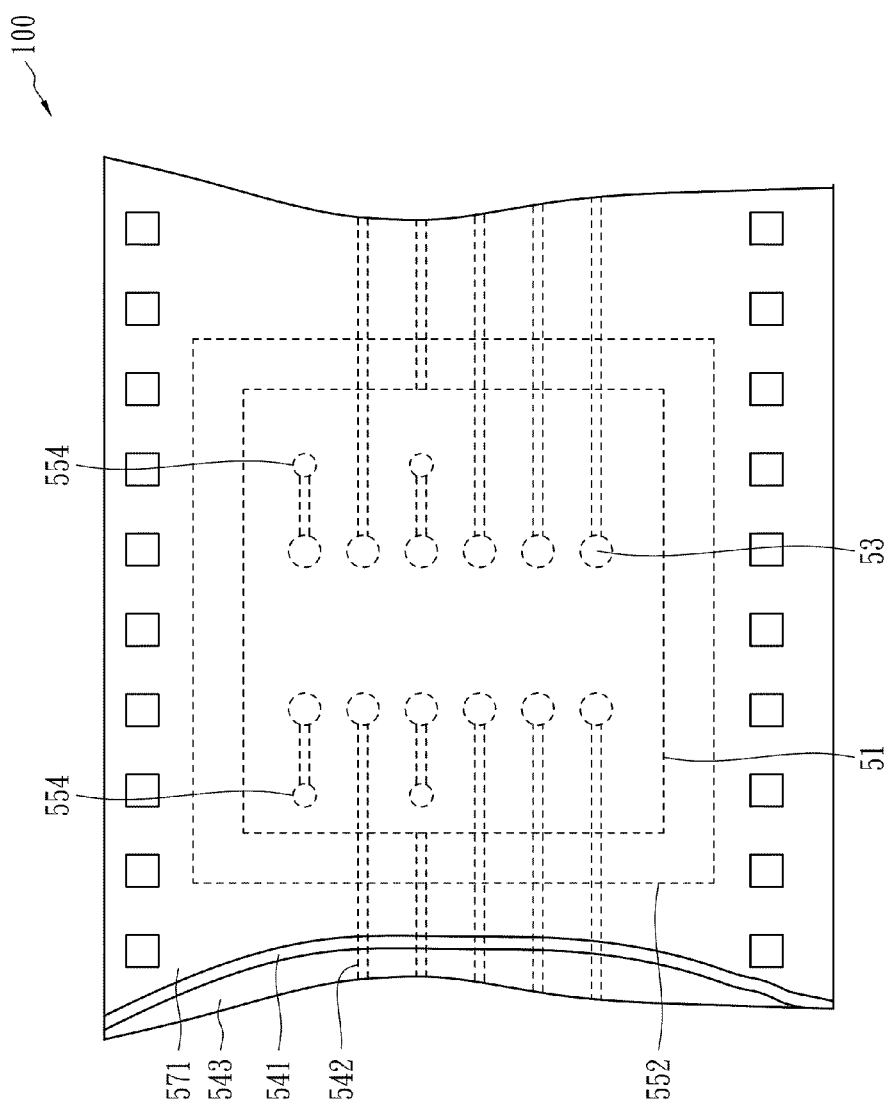
FIG. 10 shows a top view of a LCD driver package in accordance with present invention.

FIG. 10 shows a top view of a LCD driver package in accordance with present invention. The first coating layer 571 of carbon nanocapsules covers the top surface of the LCD driver package 100.

The above descriptions of the present invention are intended to be illustrative only. Numerous alternative methods may be devised by persons skilled in the art without departing from the scope of the following claims.

What is claimed is:

1. A thermally enhanced electronic package, comprising:
    a flexible carrier including:
        a flexible substrate;
        a wiring layer formed on the substrate; and
        a resistant overlaying the wiring layer;
    a driver chip connected to the wiring layer;
    an insulator disposed between the driver chip and the flexible carrier; and
    carbon nanocapsules disposed on the driver chip, on the resistant, on the flexible carrier, or in the insulator, wherein the heat generated from the diver chip is transferred by the carbon nanocapsules in a thermal radiation manner, toward an opposite side of the driver chip with respect to the flexible carrier, and the carbon nanocapsule surfaces are processed to form electric insulating layers to avoid electrical short.

2. The thermally enhanced electronic package of claim 1, further comprising a first coating layer overlaid on a passive surface of the driver chip, wherein the carbon nanocapsules are evenly distributed in the first coating layer.

3. The thermally enhanced electronic package of claim 2, wherein the first coating layer is overlaid on the insulator and the resistant.

4. The thermally enhanced electronic package of claim 1, further comprising a second coating layer overlaid on flexible substrate, wherein the carbon nanocapsules are evenly distributed in the second coating layer.

5. The thermally enhanced electronic package of claim 1, wherein the carbon nanocapsules are evenly distributed in the insulator.

* * * * *